United States Patent
Khoche et al.

(10) Patent No.: US 10,819,137 B2
(45) Date of Patent: Oct. 27, 2020

(54) ENERGY HARVESTING WIRELESS SENSING SYSTEM

(71) Applicants: Ajay Khoche, West San Jose, CA (US); Erik Volkerink, Palo Alto, CA (US)

(72) Inventors: Ajay Khoche, West San Jose, CA (US); Erik Volkerink, Palo Alto, CA (US)

( * ) Notice: Subject to any disclaimer, the term of this patent is extended or adjusted under 35 U.S.C. 154(b) by 0 days.

(21) Appl. No.: 16/359,808

(22) Filed: Mar. 20, 2019

(65) Prior Publication Data
US 2019/0222055 A1 Jul. 18, 2019

Related U.S. Application Data

(63) Continuation-in-part of application No. 15/842,861, filed on Dec. 14, 2017, now Pat. No. 10,445,634, and (Continued)

(51) Int. Cl.
| | | |
|---|---|---|
| G06K 19/07 | (2006.01) | |
| H02J 7/32 | (2006.01) | |
| G01K 1/02 | (2006.01) | |
| H04L 29/08 | (2006.01) | |
| H02J 7/02 | (2016.01) | |
| H01L 35/02 | (2006.01) | |
| B60C 23/04 | (2006.01) | |
| H02J 50/10 | (2016.01) | |
| H02N 2/00 | (2006.01) | |

(52) U.S. Cl.
CPC ............ *H02J 7/32* (2013.01); *B60C 23/0408* (2013.01); *G01K 1/024* (2013.01); *G06K 19/0704* (2013.01); *G06K 19/0723* (2013.01); *H01L 35/02* (2013.01); *H02J 7/025* (2013.01); *H02J 50/10* (2016.02); *H04L 67/12* (2013.01); *H02N 2/0075* (2013.01)

(58) Field of Classification Search
CPC .. H02J 7/32; H02J 7/025; H02J 50/10; G01K 1/024; H04L 67/12; H01L 35/02; B60C 23/0408; G06K 19/0723; G06K 19/0704; H02N 2/0075
See application file for complete search history.

(56) References Cited

U.S. PATENT DOCUMENTS

| | | |
|---|---|---|
| 5,495,250 A | 2/1996 | Ghaem et al. |
| 6,375,780 B1 | 4/2002 | Tuttle et al. |

(Continued)

FOREIGN PATENT DOCUMENTS

| | | |
|---|---|---|
| JP | 2008239282 A | 10/2008 |
| JP | 2011090670 A | 5/2011 |
| JP | 2012141995 A | 7/2012 |

OTHER PUBLICATIONS

Shad Roundy et al., Energy harvester for rotating environments using offset pendulum and nonlinear dynamics, Smart Materials and Structures, IOP Publishing Ltd, Sep. 9, 2014.

(Continued)

*Primary Examiner* — Seung H Lee

(57) ABSTRACT

The disclosure generally relates to wireless sensing nodes, energy harvesting, and energy charging. The disclosure also generally relates to reporting data gathered by the wireless sensing nodes to one or more network services.

13 Claims, 10 Drawing Sheets

Related U.S. Application Data a continuation-in-part of application No. 15/842,867, filed on Dec. 14, 2017, now Pat. No. 10,262,255.

(60) Provisional application No. 62/646,114, filed on Mar. 21, 2018, provisional application No. 62/434,218, filed on Dec. 14, 2016, provisional application No. 62/435,207, filed on Dec. 16, 2016.

(56) References Cited

U.S. PATENT DOCUMENTS

| | | | |
|---|---|---|---|
| 6,614,392 | B2 | 9/2003 | Howard |
| 7,048,194 | B2 | 5/2006 | Minami et al. |
| 7,177,054 | B2 | 2/2007 | Silverbrook et al. |
| 7,299,990 | B2 | 11/2007 | Hoshina |
| 7,405,656 | B2 | 7/2008 | Olsen |
| 7,511,616 | B2 | 3/2009 | Lake |
| 7,540,603 | B2 | 6/2009 | Otsuki |
| 7,838,844 | B2 | 11/2010 | Wagner et al. |
| 8,072,620 | B2 | 12/2011 | Yamamoto et al. |
| 8,171,791 | B2 | 5/2012 | Sy et al. |
| 8,292,173 | B2 | 10/2012 | Yturralde et al. |
| 9,643,460 | B2 * | 5/2017 | Peine .............. B60C 23/0488 |
| 9,644,401 | B2 | 5/2017 | Nguyen et al. |
| 2004/0044493 | A1 | 3/2004 | Coulthard |
| 2007/0049291 | A1 | 3/2007 | Kim et al. |
| 2007/0287473 | A1 | 12/2007 | Dupray |
| 2008/0198002 | A1 | 8/2008 | Bartholf et al. |
| 2009/0174600 | A1 | 7/2009 | Mazlum et al. |
| 2009/0192709 | A1 | 7/2009 | Yonker et al. |
| 2012/0278676 | A1 | 11/2012 | Teraura |
| 2013/0250357 | A1 | 9/2013 | Yu |
| 2014/0240088 | A1 | 8/2014 | Robinette et al. |
| 2015/0349667 | A1 * | 12/2015 | Andosca ............ H02N 2/188 310/319 |
| 2016/0011074 | A1 * | 1/2016 | Mian .................. G01M 9/06 702/50 |
| 2016/0026213 | A1 | 1/2016 | Li et al. |
| 2016/0205509 | A1 | 7/2016 | Hoperaft et al. |
| 2017/0337405 | A1 | 11/2017 | Schütz |

OTHER PUBLICATIONS

Meng-Lin Ku et al., Joint Power Waveforming and Beamforming for Wireless Power Transfer, IEEE Transactions on Signal Processing, vol. 65, No. 24, Dec. 15, 2017, p. 6409.

\* cited by examiner

US 10,819,137 B2

ENERGY HARVESTING WIRELESS SENSING SYSTEM

BACKGROUND

Wireless sensor systems are used in a variety of different applications including sensing devices for diagnostic and maintenance applications. For example, vehicles commonly are equipped with a variety of different sensors for monitoring various components that are subjected to stress and wear, and signaling when they should be replaced.

The power sources that are used for such sensor systems depend on the application. Wired power sources are most useful for stationary wireless sensing applications. Batteries are used for mobile applications but they must be replaced or recharged and therefore are not practical in many embedded sensing applications.

In an effort to overcome the limitations of wired and battery powered approaches, there has been significant effort to harvest energy from the ambient environment using one or more power harvesting techniques. For example, different energy harvesting approaches have been proposed for converting kinetic energy sources into electrical energy. Examples of such energy sources include mechanical motion, wind, ocean waves, and ambient vibrations.

SUMMARY

In one aspect, the invention features apparatus that includes a flexible adhesive tape node attached to a rotatable component and comprising an energy harvester component, a processor, a memory, a rechargeable energy source, and a wireless transmitter; wherein rotation of the rotatable component generates an electric current in the energy harvester component that powers a rechargeable energy source.

In some examples, the rotatable component is a wheel rim of the vehicle. In an example, the flexible adhesive tape node includes an RFID reader circuit attached to the wheel rim of the vehicle and configured to interrogate an RFID tag in a tire of the vehicle. In an example, the flexible adhesive tape node is attached to the wheel rim between the wheel rim and a tire of the vehicle. In an example, the flexible adhesive tape node includes a pressure sensor that generates output pressure values, and the wireless transmitter is operable to wirelessly transmit one or more data packets encoded with the output temperature values to a network address. In some examples, the flexible adhesive tape node includes a temperature sensor that generates output temperature values, and the wireless transmitter is operable to wirelessly transmit one or more data packets encoded with the output temperature values to a network address.

In some examples, the rotatable component is an axel of the vehicle. In an example, the energy harvester component of the flexible adhesive tape node comprises a vibration sensor that generates electrical energy in response to vibration at an output that is electrically connected to the rechargeable energy source. In an example, the energy harvester component of the flexible adhesive tape node includes a thermoelectric energy generator coupled to an input of the rechargeable energy source. In some examples, the thermoelectric energy generator is embedded in a bolt attached to the wheel rim.

In some examples, the energy harvester component of the flexible adhesive tape node comprises a planar electrically conductive coil that is configured to couple with the magnetic field generated by the magnetic field generation component.

In some examples, a magnetic field generation component configured to be mounted to a chassis of a vehicle adjacent a rotatable component of the vehicle; wherein rotation of the rotatable component in relation to the magnetic field generation component induces the electric current in the energy harvester component that powers the rechargeable energy source.

An exemplary apparatus includes: one or more flexible adhesive tape nodes each respectively comprising a processor, a non-volatile memory, an energy source, and a wireless transmitter, wherein at least one of the flexible adhesive tape nodes is a master node and multiple other ones of the flexible adhesive tape nodes are peripheral nodes, wherein the flexible adhesive tape nodes are adhered to the vehicle at respective locations and communicate with one another wirelessly over a wireless network. In a reconstruct phase, the master node is programmed to: establish the current network environment based on a last state of the network environment stored in its non-volatile memory, receive an optimized schedule of activities, transmit sets of coded instructions to perform those activities to respective ones of the flexible adhesive tape nodes, and store the respective sets of coded instructions in non-volatile memory. In an execute phase, the respective ones of the flexible adhesive tape nodes are programmed to execute the coded sets of instructions stored in the respective sets of coded instructions in non-volatile memory. In a prepare reconstruction phase, the master and peripheral tape nodes are programmed to determine results of the execute phase, and transmit the determined results to respective flexible adhesive tape nodes to respective next levels up in a hierarchy of the flexible adhesive tape nodes.

In some examples, in the reconstruct phase, the master node is programmed to establish the last state of the network environment based on data comprising values of variables, algorithm parameters, program counters, and energy levels of the flexible adhesive tape nodes.

In some examples, a wireless charging system includes a receiver and a beam steering wireless charger. The receiver includes a flexible adhesive tape node comprising a receiver planar coil, a processor, a memory, a rechargeable energy source, and a wireless transceiver. The beam steering wireless charger includes a flexible adhesive tape node comprising a transmitter planar coil, a processor, a memory, an energy source, and a wireless transceiver, wherein the memory of the wireless charger flexible adhesive tape node stores coded instructions to wirelessly ascertain a charge level of the rechargeable energy source of the receiver flexible adhesive tape node and, based on a determination that the charge level is below a threshold, initiate a process of wirelessly charging the rechargeable energy source by steering a radiofrequency beam toward a location of the receiver for a specified duration.

The invention also features apparatus operable to implement the method described above and computer-readable media storing computer-readable instructions causing a computer to implement the method described above.

DETAILED DESCRIPTION

Figure 1A:
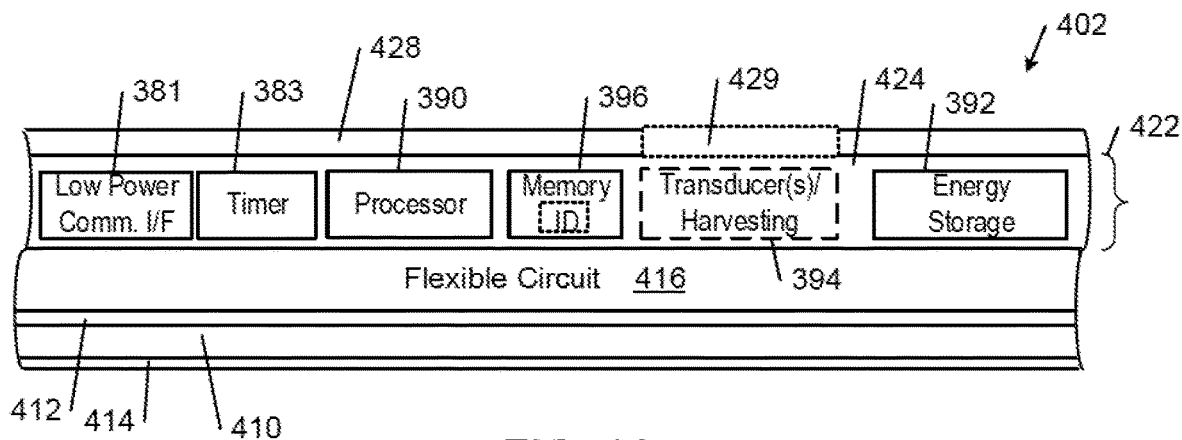
FIGS. 1A-1C show diagrammatic cross-sectional side views of portions of different respective adhesive tape platforms.

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

As used herein, the term "or" refers an inclusive "or" rather than an exclusive "or." In addition, the articles "a" and "an" as used in the specification and claims mean "one or more" unless specified otherwise or clear from the context to refer the singular form.

The term "tape node" refers to an adhesive tape platform or a segment thereof that is equipped with sensor, processor, memory, energy source/harvesting mechanism, and wireless communications functionality, where the adhesive product has a variety of different form factors, including a multilayer roll or a sheet that includes a plurality of divisible adhesive segments. Once deployed, each tape node can function, for example, as an adhesive tape, label, sticker, decal, or the like, and as a wireless communications device. A "peripheral" tape node (also referred to as an "outer" node, a "leaf" node, and "terminal" node) refers to a tape node that does not have any child nodes.

This specification describes a low-cost, multi-function adhesive tape platform with a form factor that unobtrusively integrates the components useful for implementing a combination of different functions and also is able to perform a useful ancillary function that otherwise would have to be performed with the attendant need for additional materials, labor, and expense. In an aspect, the adhesive tape platform is implemented as a collection of adhesive products that integrate wireless communications and sensing components within a flexible adhesive structure in a way that not only provides a cost-effective platform for interconnecting, optimizing, and protecting the components of the tracking system but also maintains the flexibility needed to function as an adhesive product that can be deployed seamlessly and unobtrusively into a wide variety of applications and workflows, including person and object tracking applications, and asset management workflows such as manufacturing, storage, shipping, delivery, and other logistics associated with moving products and other physical objects, including sensing, tracking, locationing, warehousing, parking, safety, construction, event detection, road management and infrastructure, security, healthcare, and other network service applications. In some examples, the adhesive tape platforms are used in various aspects of logistics management, including sealing parcels, transporting parcels, tracking parcels, monitoring the conditions of parcels, inventorying parcels, and verifying package security. In these examples, the sealed parcels typically are transported from one location to another by truck, train, ship, or aircraft or within premises, e.g., warehouses by forklift, trolleys etc.

In disclosed examples, an adhesive tape platform includes a plurality of segments that can be separated from the adhesive product (e.g., by cutting, tearing, peeling, or the like) and adhesively attached to a variety of different surfaces to inconspicuously implement any of a wide variety of different wireless communications based network communications and transducing (e.g., sensing, actuating, etc.) applications. Examples of such applications include: event detection applications, monitoring applications, security applications, notification applications, and tracking applications, including inventory tracking, package tracking, person tracking, animal (e.g., pet) tracking, manufactured parts tracking, and vehicle tracking. In example embodiments, each segment of an adhesive tape platform is equipped with an energy source, wireless communication functionality, transducing functionality, and processing functionality that enable the segment to perform one or more transducing functions and report the results to a remote server or other computer system directly or through a network of tapes. The components of the adhesive tape platform are encapsulated within a flexible adhesive structure that protects the components from damage while maintaining the flexibility needed to function as an adhesive tape (e.g., duct tape or a label) for use in various applications and workflows. In addition to single function applications, example embodiments also include multiple transducers (e.g., sensing and/or actuating transducers) that extend the utility of the platform by, for example, providing supplemental information and functionality relating characteristics of the state and or environment of, for example, an article, object, vehicle, or person, over time.

Systems and processes for fabricating flexible multifunction adhesive tape platforms in efficient and low-cost ways also are described. In addition to using roll-to-roll and/or sheet-to-sheet manufacturing techniques, the fabrication systems and processes are configured to optimize the placement and integration of components within the flexible adhesive structure to achieve high flexibility and ruggedness. These fabrication systems and processes are able to create useful and reliable adhesive tape platforms that can provide local sensing, wireless transmitting, and locationing functionalities. Such functionality together with the low cost of production is expected to encourage the ubiquitous deployment of adhesive tape platform segments and thereby alleviate at least some of the problems arising from gaps in conventional network infrastructure coverage that prevent continuous monitoring, event detection, security, tracking, and other logistics applications across heterogeneous environments.

FIG. 1A shows a cross-sectional side view of a portion of an example segment 402 of the flexible adhesive tape platform that includes a respective set of the components of the wireless transducing circuit corresponding to the first tape node type (i.e., white; referred to herein as a "peripheral tape node"). The flexible adhesive tape platform segment 402 includes an adhesive layer 412, an optional flexible substrate 410, and an optional adhesive layer 414 on the bottom surface of the flexible substrate 410. If the bottom adhesive layer 414 is present, a release liner (not shown) may be (weakly) adhered to the bottom surface of the adhesive layer 414. In some examples, the adhesive layer 414 includes an adhesive (e.g., an acrylic foam adhesive) that has a high bond strength that is sufficient to prevent removal of the adhesive segment 402 from a surface on which the adhesive layer 414 is adhered without destroying the physical or mechanical integrity of the adhesive segment 402 and/or one or more of its constituent components. In some examples, the optional flexible substrate 410 is implemented as a prefabricated adhesive tape that includes the adhesive layers 412, 414 and the optional release liner. In other examples, the adhesive layers 412, 414 are applied to the top and bottom surfaces of the flexible substrate 410 during the fabrication of the adhesive tape platform. The adhesive layer 412 bonds the flexible substrate 410 to a bottom surface of a flexible circuit 416, that includes one or more wiring layers (not shown) that connect the processor 390, a low power wireless communications interface 381 (e.g., a Zigbee, Bluetooth® Low Energy (BLE) interface, or other low power communications interface), a timer circuit 383, transducing and/or energy harvesting component(s) 394 (if present), the memory 396, and other components in a device layer 422 to each other and to the energy storage component 92 and, thereby, enable the transducing, tracking and other functionalities of the flexible adhesive tape platform segment 402. The low power wireless communications interface 81 typically includes one or more of the antennas 384, 388 and one or more of the wireless circuits 382, 386.

Figure 1B:
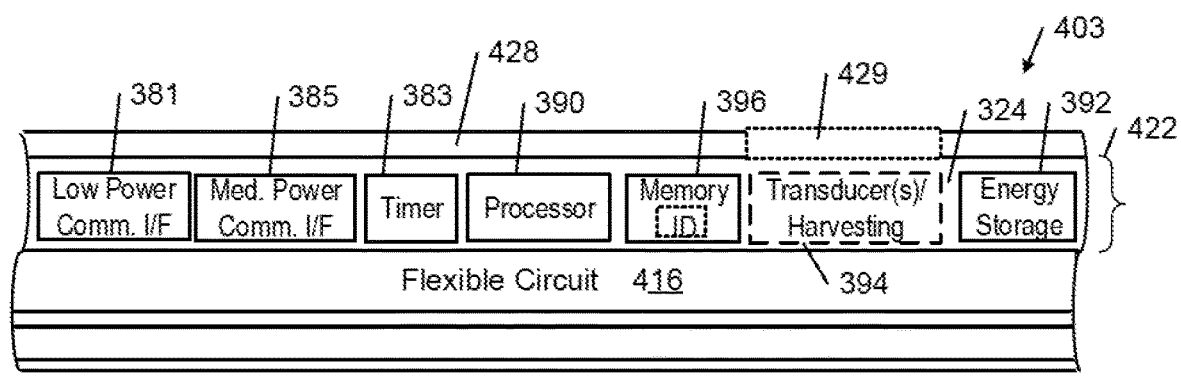

FIG. 1B shows a cross-sectional side view of a portion of an example segment 403 of the flexible adhesive tape platform that includes a respective set of the components of the wireless transducing circuit 406 corresponding to the second tape node type (i.e., green; referred to herein as an "intermediate tape node"). In this example, the flexible adhesive tape platform segment 403 differs from the segment 402 shown in FIG. 1A by the inclusion of a medium power communications interface 385 (e.g., a LoRaWAN interface) in addition to the low power communications interface that is present in the first tape node type (i.e., white). The medium power communications interface has longer communication range than the low power communications interface. In some examples, one or more other components of the flexible adhesive tape platform segment 403 differ, for example, in functionality or capacity (e.g., higher capacity energy source).

Figure 1C:
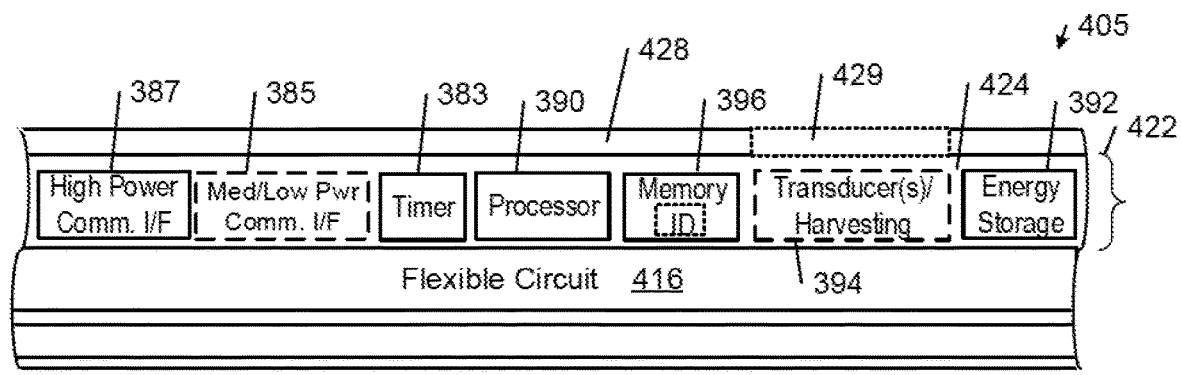

FIG. 1C shows a cross-sectional side view of a portion of an example segment 405 of the flexible adhesive tape platform that includes a respective set of the components of the wireless transducing circuit 406 corresponding to the third tape node type (i.e., black; referred to herein as a "master tape node"). In this example, the flexible adhesive tape platform segment 405 includes a high power communications interface 487 (e.g., a cellular interface; e.g., GSM/GPRS) and an optional medium and/or low power communications interface 485. The high power communication range provides global coverage to available infrastructure (e.g. the cellular network). In some examples, one or more other components of the flexible adhesive tape platform segment 405 differ, for example, in functionality or capacity (e.g., higher capacity energy source).

FIGS. 1A-1C show examples in which the cover layer 428 of the flexible adhesive tape platform includes one or more interfacial regions 429 positioned over one or more of the transducers 394. In examples, one or more of the interfacial regions 429 have features, properties, compositions, dimensions, and/or characteristics that are designed to improve the operating performance of the platform for specific applications. In some examples, the flexible adhesive tape platform includes multiple interfacial regions 429 over respective transducers 394, which may be the same or different depending on the target applications. Example interfacial regions include an opening, an optically transparent window, and/or a membrane located in the interfacial region 429 of the cover 428 that is positioned over the one or more transducers and/or energy harvesting components 394. Additional details regarding the structure and operation of example interfacial regions 129 are described in U.S. Provisional Patent Application No. 62/680,716, filed Jun. 5, 2018, and U.S. Provisional Patent Application No. 62/670,712, filed May 11, 2018, the entire contents of which are incorporated herein by reference.

In some examples, a flexible polymer layer 424 encapsulates the device layer 422 and thereby reduces the risk of damage that may result from the intrusion of contaminants and/or liquids (e.g., water) into the device layer 422. The flexible polymer layer 424 also planarizes the device layer 422. This facilitates optional stacking of additional layers on the device layer 422 and also distributes forces generated in, on, or across the adhesive tape platform segment 402 so as to reduce potentially damaging asymmetric stresses that might be caused by the application of bending, torqueing, pressing, or other forces that may be applied to the flexible adhesive tape platform segment 402 during use. In the illustrated example, a flexible cover 428 is bonded to the planarizing polymer 424 by an adhesive layer (not shown).

Figure 2:
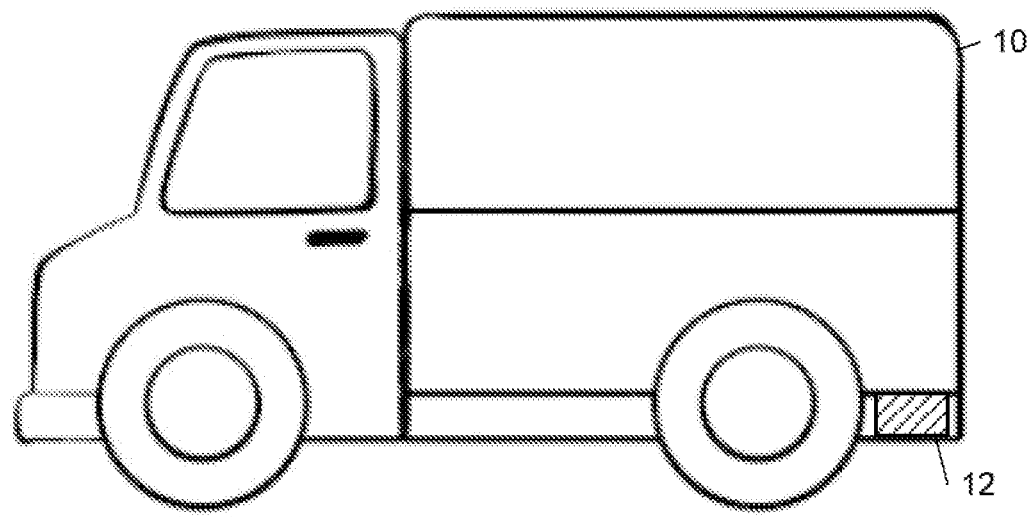
FIG. 2 is a diagrammatic view of an example vehicle carrying an energy harvesting wireless sensing unit.

FIG. 2 shows an example vehicle 10 carrying an example energy harvesting wireless sensing unit 12. In this example, the energy harvesting wireless sensing unit 12 can be located anywhere in the vehicle that is subject to any of various types of movements, including vibrations and oscillations. In some examples, the energy harvesting wireless sensing unit 12 can be located within the vehicle (e.g., in the back cargo area) or integrated with a component of the vehicle that changes its shape as it vibrates and/or oscillates (e.g., a component of the vehicle's suspension system, such as the spring assembly).

Figure 3:
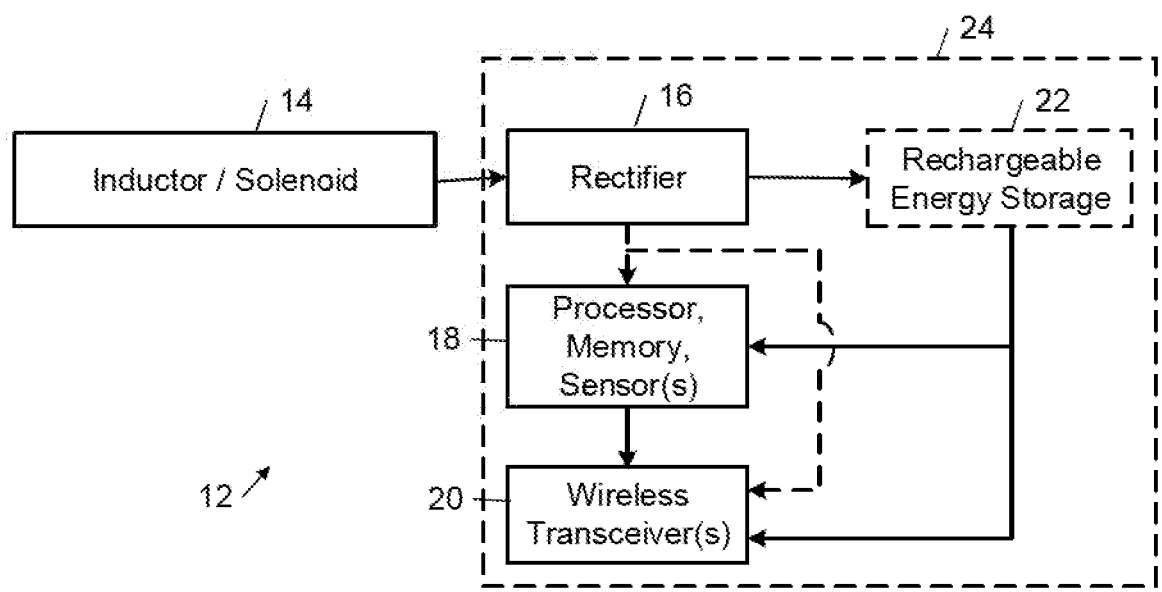
FIG. 3 is a block diagram of an example of the energy harvesting wireless sensing unit of FIG. 2A.

Referring to FIG. 3, the energy harvesting wireless sensing unit 12 includes an inductor (or a solenoid) 14, a rectifier 16, at least one processor, memory, and one or more sensors 18, a wireless transmitter 20, and optionally includes a rechargeable battery 22.

The inductor 14 can be implemented in a variety of different ways. In some examples, the inductor 14 is implemented as a coil of electrically conductive material (e.g., copper). The coil may include a core of magnetic material, in which case the inductor may be referred to as a solenoid.

In some examples, one or more piezoelectric electric devices can be mounted on the shape-changing component to generate electricity in response to strain created by the changes in the shape of the suspension system component. In other examples, one or more induction-based energy harvesting devices can be mounted to components of a vehicle subject to translational motion relative to one another (e.g., the exterior housing and interior piston of a vehicle's shock absorber). In some of these examples, a coil or solenoid (e.g., a coil surrounding a high permeability core) can be mounted around the exterior housing of the shock absorber, and one or more permanent magnetics can be mounted on the piston, whereby electricity is generated in response to reciprocation of the piston within the exterior housing of the shock absorber when the vehicle 10 drives over bumps and other irregularities on a road.

The rectifier 16 converts the alternating electrical current received from the inductor (or solenoid) 14 into direct electrical current that powers at least one processor, memory, one or more sensors 18, and a wireless transmitter 20, and recharges an optional rechargeable battery 22.

The one or more sensors 18 can include any of a wide variety of different sensor systems depending on the target application. For example, sensors are used routinely to monitor vehicles and other equipment for realtime predictive and condition-based maintenance. Such monitoring includes detecting components that require maintenance or are susceptible to imminent failure, such as tires, bearings, etc. Example sensors include pressure sensors, vibration sensors, image sensors (e.g., infrared sensors), light sensors, acoustic sensors, liquid analysis sensors, electrical sensors (e.g., ammeters), temperature sensors, altimeters, flow sensors, and location sensors (e.g., GPS sensors).

The wireless transmitter 20 can include one or more transmitters and/or transceivers for transmitting and/or receiving wireless signals to/from other wireless devices.

Figure 4:
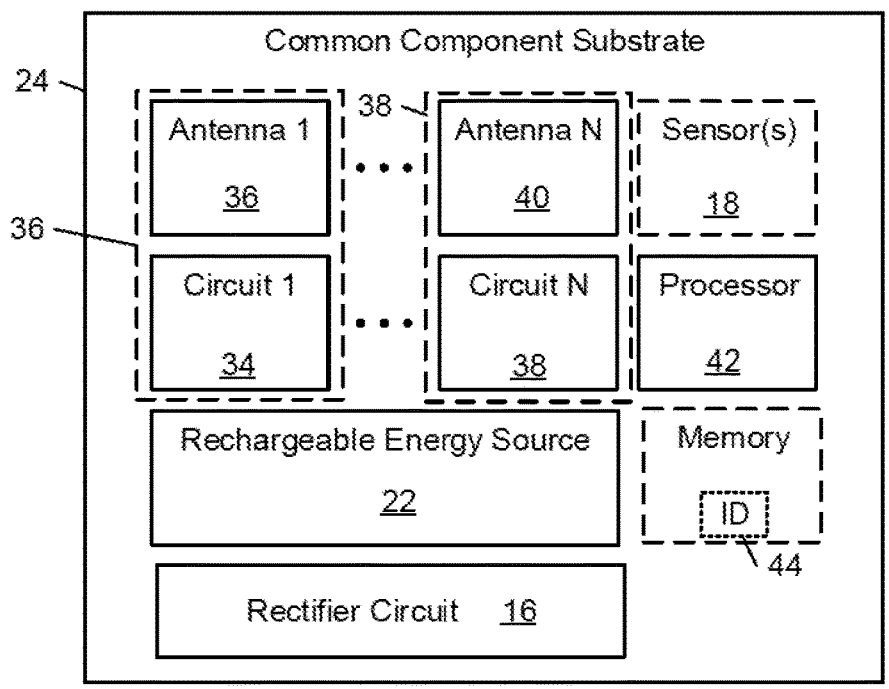
FIG. 4 is a schematic view of a common support substrate for components of an example energy harvesting wireless sensing unit.

Referring to FIG. 4, in some examples, the rectifier 16, the sensor(s) 18, the wireless transceiver(s) 20, and the rechargeable battery 22 are co-located on a common component substrate 24. In the illustrated example, the wireless transceiver(s) 20 include a number of communication systems 26, 28. Example communication systems 26, 28 include a GPS system that includes a GPS receiver circuit 34 (e.g., a receiver semiconductor circuit) and a GPS antenna 36, and one or more wireless communication systems each of which includes a respective transceiver circuit 38 (e.g., a transceiver semiconductor circuit) and a respective antenna 40. Example wireless communication systems include a cellular communication system (e.g., GSM/GPRS), a Wi-Fi communication system, an RF communication system (e.g., LoRa), a Bluetooth communication system (e.g., a Bluetooth Low Energy system), a Z-wave communication system, and a ZigBee communication system. The common component substrate 24 also includes a processor 42 (e.g., a microcontroller or microprocessor). The rechargeable battery 22 may be, e.g., a printed flexible battery or a conventional single or multiple cell rechargeable battery. Example sensors include, a capacitive sensor, an altimeter, a gyroscope, an accelerometer, a temperature sensor, a strain sensor, a pressure sensor, a light sensor, a humidity sensor, and other sensors mentioned in this disclosure. In some examples, the common component substrate 24 includes a memory 44 for storing data (e.g., location data and a unique identifier (ID) associated with the common component substrate 24). In some examples, the memory 44 may be incorporated into one or more of the processor 42 or sensors 18, or may be a separate component that is integrated in the common component substrate 24 as shown in FIG. 3.

Figure 5:
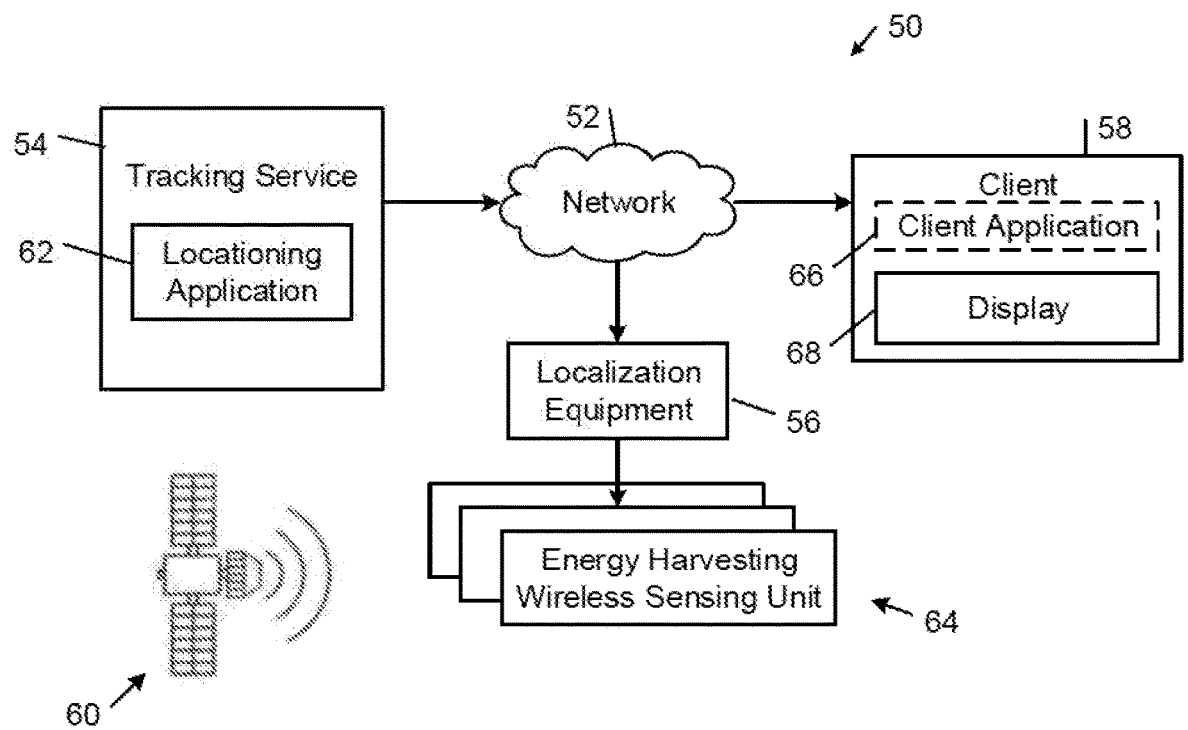
FIG. 5 is a diagrammatic view of an example of a network environment supporting location tracking for examples of the energy harvesting wireless sensing unit.

FIG. 5 shows an example network environment 50 that includes a network 52 that supports communications between a tracking service 54, localization equipment 56, and a client device 58. The network 52 includes one or more network communication systems and technologies, including any one or more of wide area networks, local area networks, public networks (e.g., the internet), private networks (e.g., intranets and extranets), wired networks, and wireless networks. The localization equipment 56 includes any one or more of (i) satellite based tracking systems 60 (e.g., GPS, GLONASS, and NAVSTAR) that transmit geolocation data that can be received by suitably equipped receivers in the communications systems 26, 28, (ii) cellular based systems that use mobile communication technologies (e.g., GSM, GPRS, CDMA, etc.) to implement one or more cell-based localization techniques, and (iii) localization equipment 56, such as wireless access points (e.g., Wi-Fi nodes, Bluetooth nodes, ZigBee nodes, etc.) and other shorter range localization technologies (e.g., ultrasonic localization and/or dead reckoning based on motion sensor measurements).

Location data for a location tracking energy harvesting wireless sensing unit 64 can be obtained using one or more of the localization systems and technologies described above.

For example, a location tracking energy harvesting wireless sensing unit 64 that includes a GPS receiver is operable to receive location data (e.g., geolocation data) from the Global Positioning System (GPS). In this process, the tracking energy harvesting wireless sensing unit 64 periodically monitors signals from multiple GPS satellites. Each signal contains information about the time the signal was transmitted and the position of the satellite at the time of transmission. Based on the location and time information for each of four or more satellites, the GPS receiver determines the geolocation of the tracking energy harvesting wireless sensing unit 64 and the offset of its internal clock from true time. Depending on its configuration, the tracking energy harvesting wireless sensing unit 64 can either forward the received GPS location data to the tracking service 54 to determine its geolocation, or first compute geolocation coordinates from the received GPS location data and report the computed geolocation coordinates to the tracking service 54. However, the tracking energy harvesting wireless sensing unit 64 can only determine its GPS location when it is able to receive signals from at least four GPS satellites at the same time. As a result, GPS localization typically is limited or unavailable in urban environments and indoor locations.

Instead of or in addition to GPS localization, a tracking energy harvesting wireless sensing unit 64 can be configured to determine or assist in determining its location using terrestrial locationing techniques. For example, Received Signal Strength Indicator (RSSI) techniques may be used to determine the location of a tracking energy harvesting wireless sensing unit 64. These techniques include, for example, fingerprint matching, trilateration, and triangulation. In an example RSSI fingerprinting process, one or more predetermined radio maps of a target area are compared to geo-reference RSSI fingerprints that are obtained from measurements of at least three wireless signal sources (e.g., cellular towers or wireless access points) in the target area to ascertain the location of the tracking energy harvesting wireless sensing unit 64. The predetermined radio maps typically are stored in a database that is accessible by the tracking service 54. In example RSSI triangulation and trilateration processes, the location of a tracking energy harvesting wireless sensing unit 64 can be determined from measurements of signals transmitted from at least three omnidirectional wireless signal sources (e.g., cellular towers or wireless access points). Examples of the triangulation and trilateration localization techniques may involve use of one or more of time of arrival (TOA), angle of arrival (AOA), time difference of arrival (TDOA), and uplink-time difference of arrival (U-TDOA) techniques. RSSI fingerprint matching, trilateration, and triangulation techniques can be used with cellular and wireless access points that are configured to communicate with any of a variety of different communication standards and protocols, including GSM, CDMA, Wi-Fi, Bluetooth, Bluetooth Low Energy (BLE), LoRa, ZigBee, Z-wave, and RF.

In some examples, a tracking energy harvesting wireless sensing unit 64 includes a GSM/GPRS transceiver can scan GSM frequency bands for signals transmitted from one or more GSM cellular towers. For each signal received by the tracking energy harvesting wireless sensing unit 64, the tracking energy harvesting wireless sensing unit 64 can determine the signal strength and the identity of the cellular tower that transmitted the signal. The tracking energy harvesting wireless sensing unit 64 can send the signal strength and transmitter identifier to the tracking service 54 to determine the location of the energy harvesting wireless sensing unit 64. If signal strength and transmitter identifier are available from only one cellular tower, the tracking service 54 can use nearest neighbor localization techniques to determine the location of the tracking energy harvesting wireless sensing unit 64. If signal strength and transmitter identifier is received from two or more cellular towers, the tracking service 54 can use localization techniques, such as fingerprint matching, trilateration, and triangulation, to calculate the position of the tracking energy harvesting wireless sensing unit 64.

In some examples, a tracking energy harvesting wireless sensing unit 64 that includes a Wi-Fi (Wireless-Fidelity) transceiver can scan Wi-Fi frequency bands for signals transmitted from one or more Wi-Fi access points. For each signal received by the tracking energy harvesting wireless sensing unit 64, the tracking energy harvesting wireless sensing unit 64 can determine the signal strength and the identity of the access point that transmitted the signal. The tracking energy harvesting wireless sensing unit 64 can send the signal strength and transmitter identifier information to the tracking service 54 to determine the location of the energy harvesting wireless sensing unit 64. If signal strength and transmitter identifier information is available from only one Wi-Fi access point, the tracking service 54 can use nearest neighbor localization techniques to determine a location of the energy harvesting wireless sensing unit 64. If signal strength and transmitter identifier information is received from two or more Wi-Fi access points, the tracking service 54 can use localization techniques, such as trilateration, and triangulation, to calculate the position of an energy harvesting wireless sensing unit 64. RSSI fingerprint matching also can be used to determine the location of the tracking energy harvesting wireless sensing unit 64 in areas (e.g., indoor and outdoor locations, such as malls, warehouses, airports, and shipping ports) for which one or more radio maps have been generated.

In some examples, the wireless transceiver in the tracking energy harvesting wireless sensing unit 64 can transmit a wireless signal (e.g., a Wi-Fi, Bluetooth, Bluetooth Low Energy, LoRa, ZigBee, Z-wave, and/or RF signal) that includes the identifier of the tracking energy harvesting wireless sensing unit 64. The wireless signal can function as a beacon that can be detected by a mobile computing device (e.g., a mobile phone) that is suitably configured to ascertain the location of the source of the beacon. In some examples, a user (e.g., an operator affiliated with the tracking service 54) may use the mobile computing device to transmit a signal into an area (e.g., a warehouse) that includes the identifier of a target tracking energy harvesting wireless sensing unit 64 and configures the target tracking energy harvesting wireless sensing unit 64 to begin emitting the wireless beacon signal. In some examples, the target tracking energy harvesting wireless sensing unit 64 will not begin emitting the wireless beacon signal until the user/operator self-authenticates with the tracking service 54.

The tracking service 54 includes one or more computing resources (e.g., server computers) that can be located in the same or different geographic locations. The tracking service 54 executes a locationing application 62 to determine the locations of activated tracking energy harvesting wireless sensing units 64. In some examples, based on execution of the locationing application 62, the tracking service 54 receives location data from one or more of the energy harvesting wireless sensing units 64. In some examples, the tracking service 54 processes the data received from tracking energy harvesting wireless sensing units 64 to determine the physical locations of the tracking energy harvesting wireless sensing units 64. For example, the energy harvesting wireless sensing units 64 may be configured to obtain locationing information from signals received from a satellite system (e.g., GPS, GLONASS, and NAVSTAR), cell towers, or wireless access points, and send the locationing information to the tracking service 54 to ascertain the physical locations of the tracking energy harvesting wireless sensing units 64. In other examples, the tracking energy harvesting wireless sensing units 64 are configured to ascertain their respective physical locations from the signals received from a satellite system (e.g., GPS, GLONASS, and NAVSTAR), cell towers, or wireless access points, and to transmit their respective physical locations to the tracking service 54. In either or both cases, the tracking service 54 typically stores the locationing information and/or the determined physical location for each tracking energy harvesting wireless sensing unit 64 in association with the respective unique identifier of the tracking energy harvesting wireless sensing unit. The stored data may be used by the tracking service 54 to determine time, location, and state (e.g., sensor based) information about the tracking energy harvesting wireless sensing units 64 and the objects or persons to which the tracking energy harvesting wireless sensing units 64 are attached. Examples of such information include tracking the current location of a tracking energy harvesting wireless sensing unit 64, determining the physical route traveled by the tracking energy harvesting wireless sensing unit 64 over time, and ascertaining stopover locations and durations.

As shown FIG. 5, the client device 58 includes a client application 66 and a display 68. The client application 66 establishes sessions with the tracking service 54 during which the client application obtains information regarding the locations of the tracking energy harvesting wireless sensing units 64. In some examples, a user of the client device 58 must be authenticated before accessing the tracking service 54. In this process, the user typically presents multiple authentication factors to the system (e.g., user name and password). After the user is authenticated, the tracking service 54 transmits to the client device 58 data associated with the user's account, including information relating to the tracking energy harvesting wireless sensing units 64 that are associated with the user's account. The information may include, for example, the current location of a particular tracking energy harvesting wireless sensing unit 64, the physical route traveled by the tracking energy harvesting wireless sensing unit 64 over time, stopover locations and durations, and state and/or changes in state information (as measured by one or more sensors associated with the tracking energy harvesting wireless sensing unit 64). The information may be presented in a user interface on the display 68. Location and state information may be presented in the user interface in any of a variety of different ways, including in a table, chart, or map. In some examples, the location and state data presented in the user interface are updated in real time.

Figure 6A:
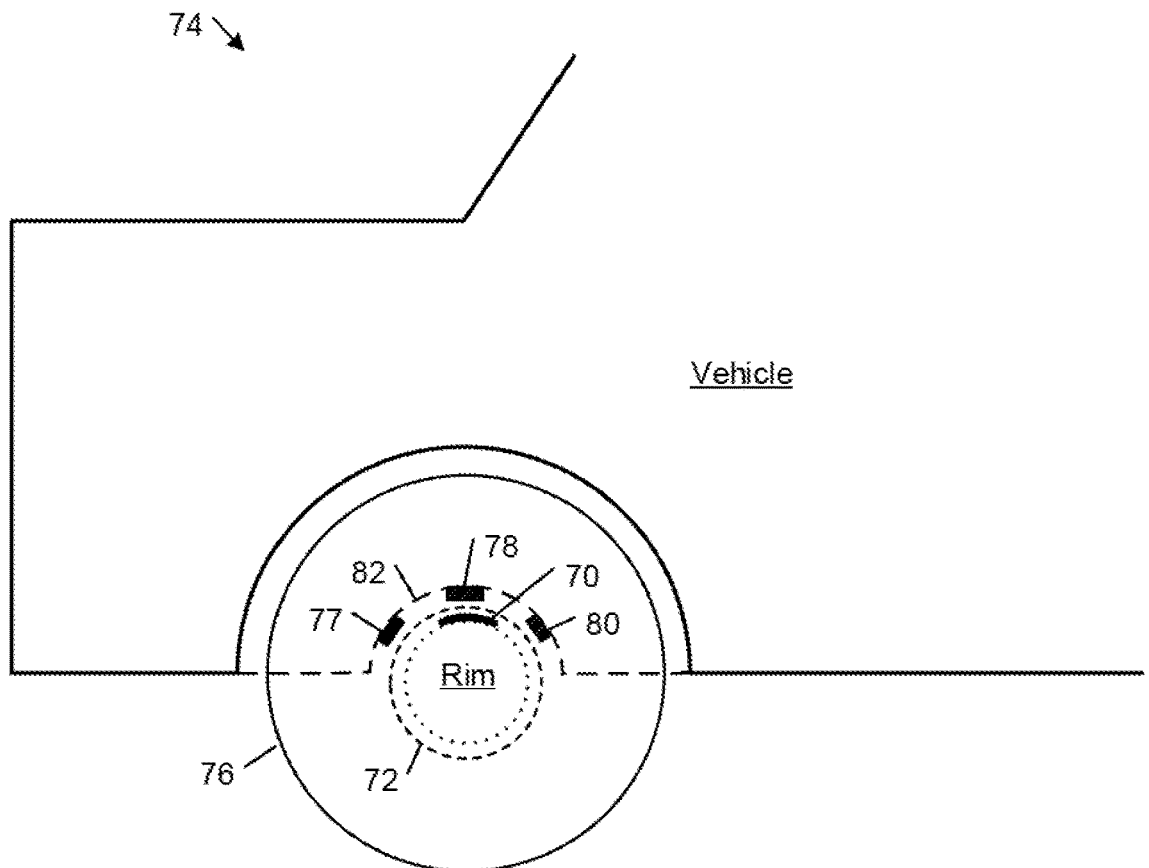
FIG. 6A is a diagrammatic view of an example array of one or more stationary permanent magnets configured to magnetically couple with an energy harvesting wireless sensing unit embedded in a wheel rim of a vehicle.
Figure 6B:
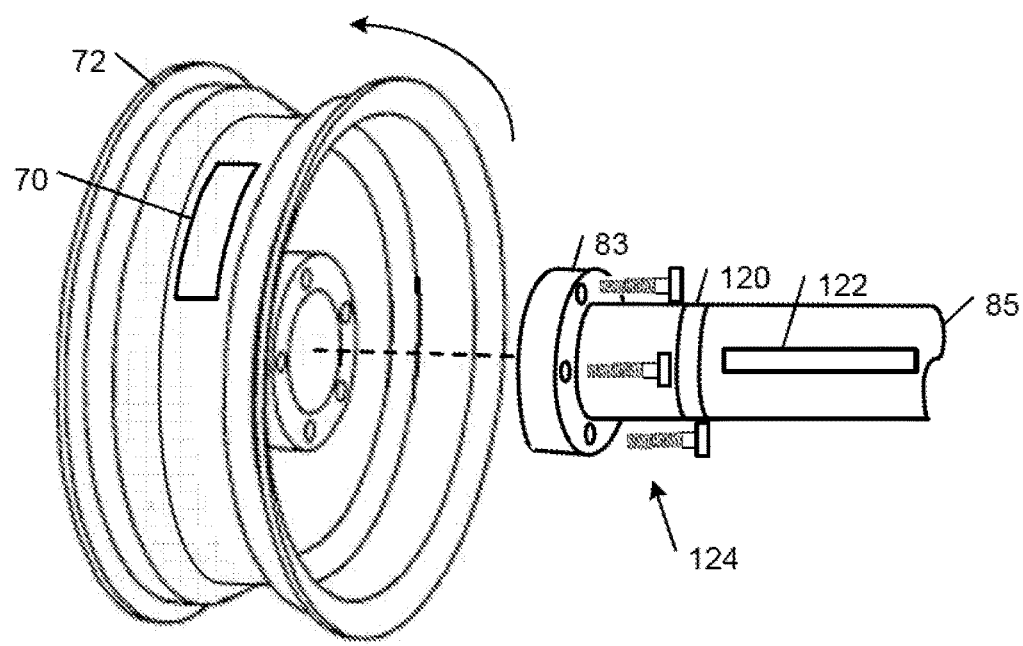
FIG. 6B shows an example of the wheel rim shown in FIG. 6A.

Referring to FIGS. 6A and 6B, in some examples, an energy harvesting wireless sensing unit 70 is attached to a wheel rim 72 of a vehicle 74, between the outer circumferential surface of the wheel rim 72 and the tire 76. In general, the energy harvesting wireless sensing unit 70 may include any of the components of the common component substrate 24 shown and discussed in connection with FIG. 3, including but not limited to one or more wireless communication systems each of which includes a respective transceiver circuit 38 (e.g., a transceiver semiconductor circuit), a respective antenna 40, one or more sensors 18, a processor 42, and processor readable memory. For example, the energy harvesting wireless sensing unit 70 may include, between the wheel rim 72 and the tire 76, one or more pressure sensors that are configured (e.g., calibrated) to directly measure the tire pressure at scheduled intervals and wirelessly transmit information regarding the measured pressure to a receiver unit in the driver's dashboard interface of the vehicle 74. The information regarding the measured tire pressure also may be reported to a network service (e.g., a rental car company or a ride hailing service). Other parameters that can be measured and reported include, for example, acceleration, temperature, humidity, and wheel rotation rate.

In some examples, the wheel rim 72 is casted out of aluminum or aluminum alloy with an exterior surface that is configured to support one or more of the components of the energy harvesting wireless sensing unit 70. In some embodiments, the energy harvesting wireless sensing unit 70 includes an inductor and/or solenoid, a rectifier, one or more sensors, one or more wireless transceivers, and optionally a rechargeable battery or capacitor (e.g., a supercapacitor). After the energy harvesting wireless sensing unit 70 is installed on the surface of the wheel rim 72, the tire 76 is mounted on the wheel rim 72 over the energy harvesting wireless sensing unit 70. In general, one or more respective energy harvesting wireless sensing units 70 may be attached to one or more of the wheel rims 72 of the vehicle 74.

In the illustrated example shown in FIG. 6A, one or more permanent magnets 77, 78, 80 are mounted to the chassis 82 (or frame) of the vehicle 74. The magnets 77, 78, 80 are mounted at respective locations on the chassis 82 that are adjacent to the wheel rim 72. In addition to other factors, the degree of coupling between the embedded energy harvesting wireless sensor unit 70 and the magnets 77-80 decreases with the distance separating the energy harvesting wireless sensor unit 70 from the magnets 77, 78, 80. In some examples, the separation distance between the magnets 77, 78, 80 and the energy harvesting wireless sensor unit 70 on the wheel rim 72 is approximately 2-5 cm; in other examples, the separation distance is in the range of 2-10 cm.

FIG. 6B shows an example of the wheel rim 72. As the wheel rim 72 rotates, an inductor (or solenoid) embedded in the energy harvesting wireless sensor unit 70 experiences a diverse magnetic field that is produced by the magnets 77, 78, 80 that are fixed to the vehicle 74. A maximized flux change is induced in the inductor (or solenoid) when it is directly adjacent each magnet 77, 78, 80. The flux change induces a voltage in the inductor (or solenoid) with a frequency related to the rotational speed of the wheel rim 72 and the number of magnets on the vehicle chassis 82.

Figure 7A:
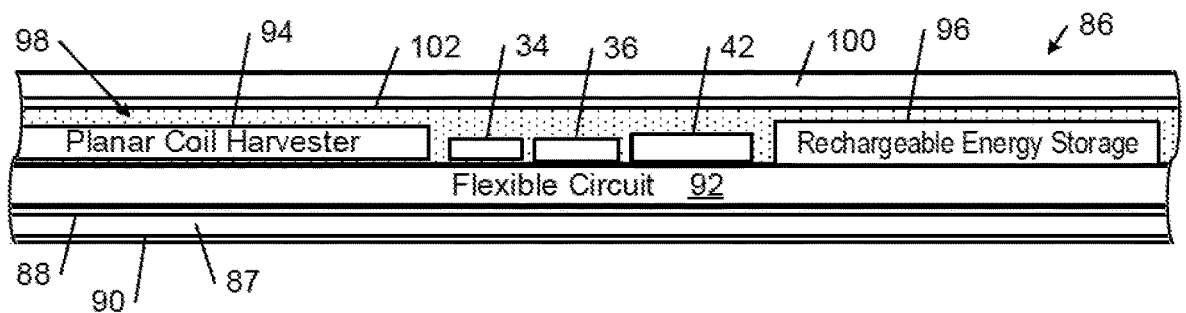
FIG. 7A shows a cross-sectional side view of a portion of an embodiment of an energy harvesting wireless sensing unit.

FIG. 7A shows a cross-sectional side view of a portion of an embodiment 86 of the energy harvesting wireless sensing unit 70 in the form of a flexible adhesive tape. In general, the energy harvesting wireless sensing unit 70 may include any of the components of the common component substrate 24 shown and discussed in connection with FIG. 4, including but not limited to one or more wireless communication systems each of which includes a respective transceiver circuit 34 (e.g., a transceiver semiconductor circuit), a respective antenna 36, one or more sensors, a processor 42, and processor readable memory 44. The energy harvesting wireless sensing unit 86 includes a flexible substrate 87 with an adhesive layer 88 on its top surface and an optional adhesive layer 90 on its bottom surface. If the bottom adhesive layer 90 is present, a release liner (not shown) may be (weakly) adhered to the bottom surface of the adhesive layer 90. The adhesive layer 88 bonds the flexible substrate 87 to a bottom surface of a flexible circuit 92 that includes one or more wiring layers (not shown) that connect a processor, a circuit (e.g., a wireless receiver circuit, wireless transmitter circuit, or wireless transceiver circuit), an antenna, and other components including, for example, one or more sensors, and a planar coil energy harvester 94 in a device layer 98 of the energy harvesting wireless sensing unit 70, to each other and to the flexible rechargeable battery 96 and, thereby, enable the energy generation, the tracking and other functionalities of the energy harvesting wireless sensing unit 70. A flexible polymer layer 98 encapsulates the device layer and thereby reduces the risk of damage that may result from the intrusion of contaminants and/or liquids (e.g., water) into the device layer. The flexible polymer layer 98 also planarizes the device, which distributes forces generated in, on or across the energy harvesting wireless sensing unit 70 so as to reduce potentially damaging asymmetric stresses that might be caused by the application of bending, torqueing, pressing, vibrations or other forces on the energy harvesting wireless sensing unit 70. A flexible cover 100 is bonded to the planarizing polymer 98 by an adhesive layer 102.

In some examples, the flexible adhesive tape 86 may be fabricated according to a roll-to-roll fabrication process that is related to the fabrication process described in U.S. patent application Ser. No. 15/842,861, filed Dec. 14, 2017, the entirety of which is incorporated herein by reference.

Figure 7B:
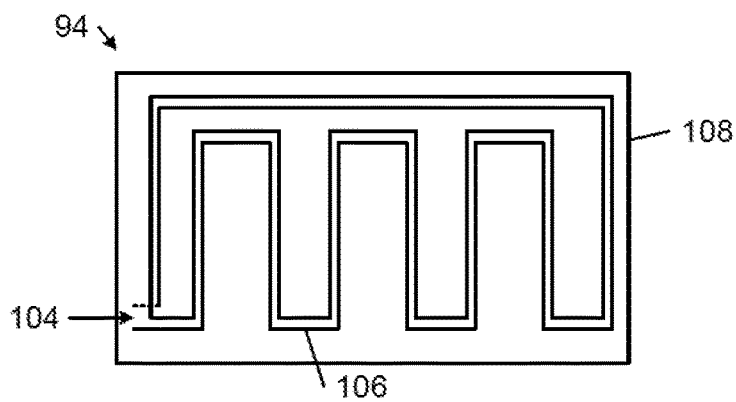
FIG. 7B shows an embodiment of a planar coil energy harvester shown in FIG. 7A.

FIG. 7B shows an embodiment of the planar coil energy harvester 94 shown in FIG. 6A. In this embodiment, the planar coil 104 is formed on one or more flexible layers of electrically insulating material on which is formed one or more electrically conducting planar coil traces 106 that are electrically connected together using interlayer electrical connections. In operation, as the wheel rim 72 rotates, the planar coil energy harvester 94 that is embedded in the energy harvesting wireless sensor unit 70 experiences a diverse magnetic field that is produced by the magnets 77, 78, 80 that are fixed to the chassis of the vehicle 74. A maximized flux change is induced in the planar coil energy harvester 94 when it is directly adjacent each magnet 77, 78, 80. The flux change induces a voltage in the planar coil energy harvester 94 with a frequency related to the rotational speed of the wheel rim 72 and the number of magnets on the vehicle chassis.

Figure 7C:
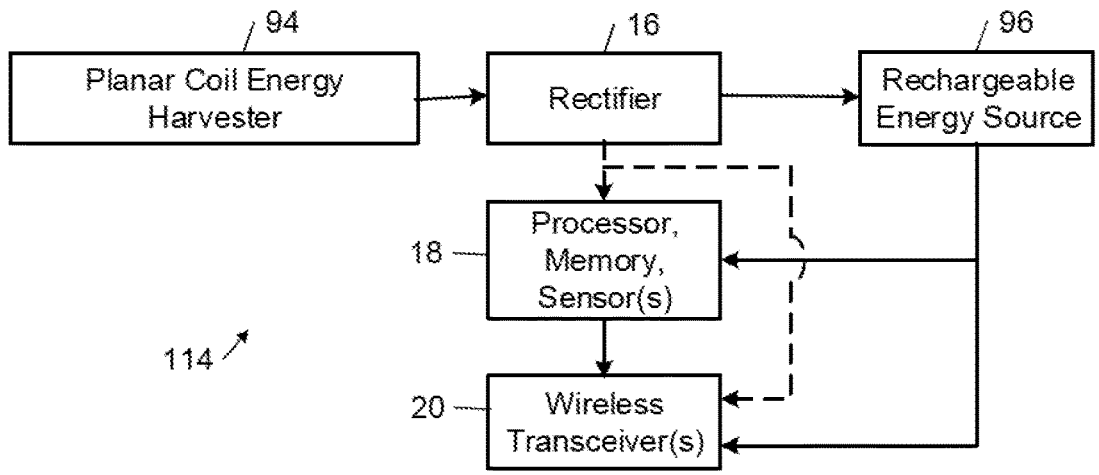
FIG. 7C shows an embodiment of a planar coil energy harvester 94 connected to a rectifier that rectifies the output of the planar coil energy harvester.

Referring to FIG. 7C, the planar coil energy harvester 94 is connected to a rectifier 16 that rectifies the output of the planar coil energy harvester 94. The rectified output generated by the rectifier 16 charges the flexible rechargeable energy source 96 (e.g., a rechargeable battery or a capacitor) and optionally directly powers at least one processor, memory, and one or more sensors 18. In some embodiments, the flexible rechargeable battery 96 is replaced or supplemented by one or more other types of energy storage devices, including a capacitor (e.g., a supercapacitor).

Figure 8A:
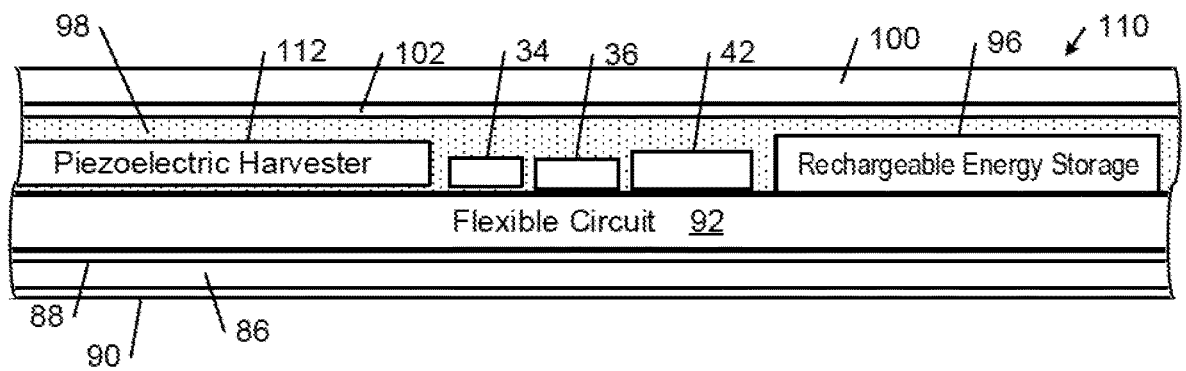
FIG. 8A is a diagrammatic view of an example of a piezoelectric energy harvesting wireless sensing unit.

FIG. 8A shows an embodiment 110 of the energy harvesting wireless sensing unit 70 that corresponds to the embodiment shown in FIG. 7A except for the replacement of the planar coil energy harvester 94 with a piezoelectric energy harvester 112. In general, the energy harvesting wireless sensing unit 110 may include any of the components of the common component substrate 24 shown and discussed in connection with FIG. 4, including but not limited to one or more wireless communication systems each of which includes a respective transceiver circuit 34 (e.g., a transceiver semiconductor circuit), a respective antenna 36, one or more sensors, a processor 42, and processor readable memory 44. The piezoelectric energy harvester 112 includes one or more piezoelectric elements that output a voltage when deformed as a result of exposure of the flexible substrate of the wireless sensing unit 70 to forces, such as linear forces, rotational forces, vibrations, etc., where the magnitude of the output voltage increases with the degree of deformation of the piezoelectric element. In some embodiments, the piezoelectric energy harvester 12 has the shape of a flexible elongated planar beam.

In some examples, the flexible adhesive tape 110 may be fabricated according to a roll-to-roll fabrication process that is similar to the process described in connection with FIGS. 6, 7A, and 7B of U.S. patent application Ser. No. 15/842,861, filed Dec. 14, 2017, the entirety of which is incorporated herein by reference.

Figure 8B:
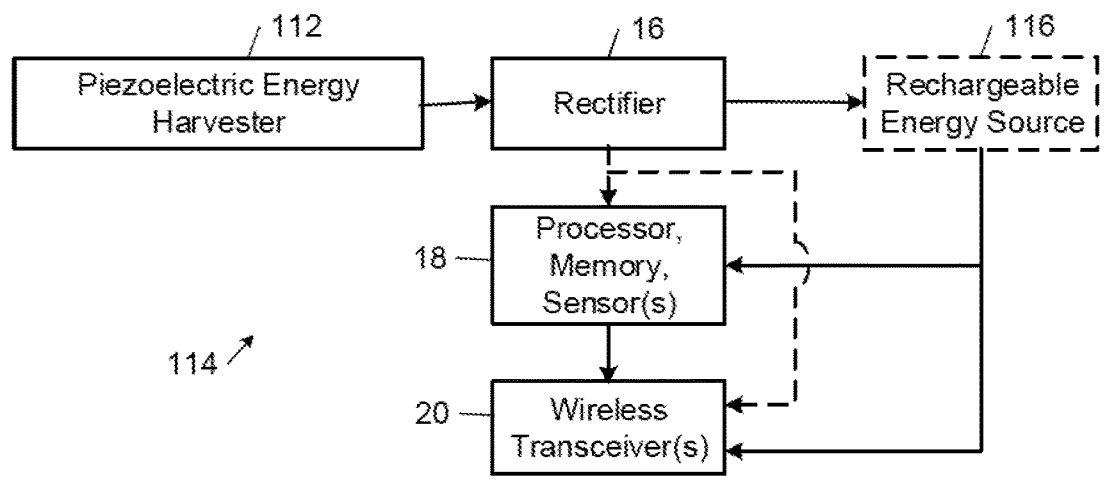
FIG. 8B shows an embodiment of a piezoelectric energy harvesting wireless sensing circuit.

FIG. 8B shows an embodiment of a piezoelectric energy harvesting wireless sensing circuit 114 that includes a piezoelectric energy harvester 112, one or more sensors 18, including an optional location tracking system, that are electrically connected to a rechargeable energy source 116, which may be located in the flexible adhesive product 110. The piezoelectric energy harvester 112 is connected to a rectifier 16 that rectifies the output of the piezoelectric energy harvester 112. The rectified output of the rectifier 16 charges the flexible rechargeable energy source 116 and optionally directly powers the at least one processor, memory, and one or more sensors 18. In some embodiments, the flexible rechargeable battery 96 is replaced or supplemented by one or more other types of energy storage devices, including a capacitor (e.g., a supercapacitor). The wireless sensing circuit 114 can use one or more of the wireless transceivers 20 to communicate with one or more of network services described above (including locationing services, such as GPS) to determine or report data or information (e.g., the realtime geographic position of the energy harvesting wireless sensing circuit 132), which may be used in a variety of different applications, including logistics and the other tracking, sensing, monitoring, and reporting applications described above.

Referring back to FIG. 6B, embodiments 120, 122 of the piezoelectric energy harvesting wireless sensing unit 110 are adhered to the axel 85, which rotates the wheel rim 72. In some embodiments, one or both of the piezoelectric energy harvesting sensing units 120, 122 includes a gyroscope (e.g., a MEMS gyroscope) that can measure angular velocity and orientation at scheduled intervals and wirelessly transmit information regarding the measured parameters to a receiver unit in the driver's dashboard interface of the vehicle 74. The information regarding the measured angular velocity also may be reported a network service (e.g., a rental car company or a ride hailing service). Other parameters that can be measured, reported, or otherwise acted upon include acceleration, temperature, humidity, wheel slippage, and wheel rotation rate.

FIG. 6B also shows several threaded bolts 124 that are used to secure the bearings (not shown) to the wheel rim 72. In some embodiments, the bolts 124 include thermal energy harvesting components to harvest energy from the substantial difference in temperatures between the distal ends of the bolts 124 and the proximal ends of the bolts 124. In particular, during movement of the vehicle 24, the wheel bearings heat lubricating oil in the bearings track to relatively high temperatures (e.g., on the order of 120° C.), which in turn heats the distal ends of the bolts 124. In these embodiments, the thermal energy difference between the proximal and distal ends of the bolts can be exploited to enable thermoelectric energy harvesting in the bolts.

Figure 9A:
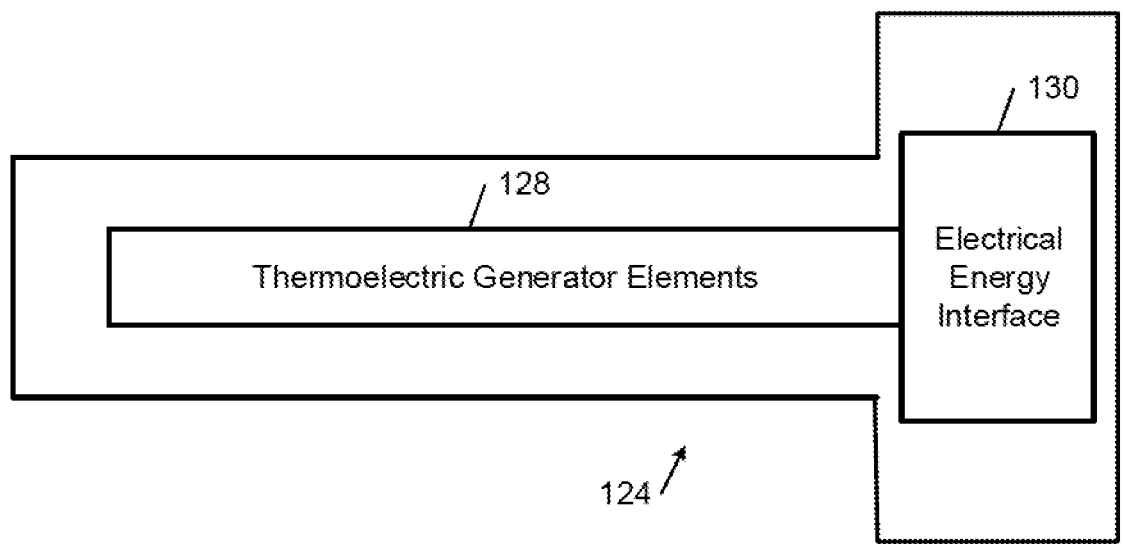
FIG. 9A shows a diagrammatic view of an embodiment of a bolt that is configured to generate electrical energy.

FIG. 9A shows a diagrammatic view of an embodiment of one 126 of the bolts 124 that is configured to generate electrical energy from the temperature difference between the proximal and distal ends of the bolt 126. In general, the thermoelectric generator 128 may be any type of thermoelectric energy generating device that is compatible with the bolt form factor and operating environment. In an example embodiment, the thermoelectric energy generating device is a solid state device that provides direct electrical energy generation from a thermal energy temperature gradient along the bolt 126 based on the "Seebeck effect". In the illustrated embodiment, the bolt 126 includes a plurality of thermoelectric elements 128 (e.g., a plurality of electrically coupled pairs of n-type and p-type conductivity semiconductor elements in parallel) in a distal (hot) end of the bolt 124, and an electrical energy output and/or storage interface 130 in a proximal (cooler) end (e.g., head) of the bolt, which functions as a heat sink. In some embodiments, the electrical energy storage interface includes an electrical energy storage device (e.g., a rechargeable battery or a capacitor, such as a supercapacitor). In other embodiments, the electrical energy storage device is a separate external component that is electrically coupled to the electrical energy interface 130.

Figure 9B:
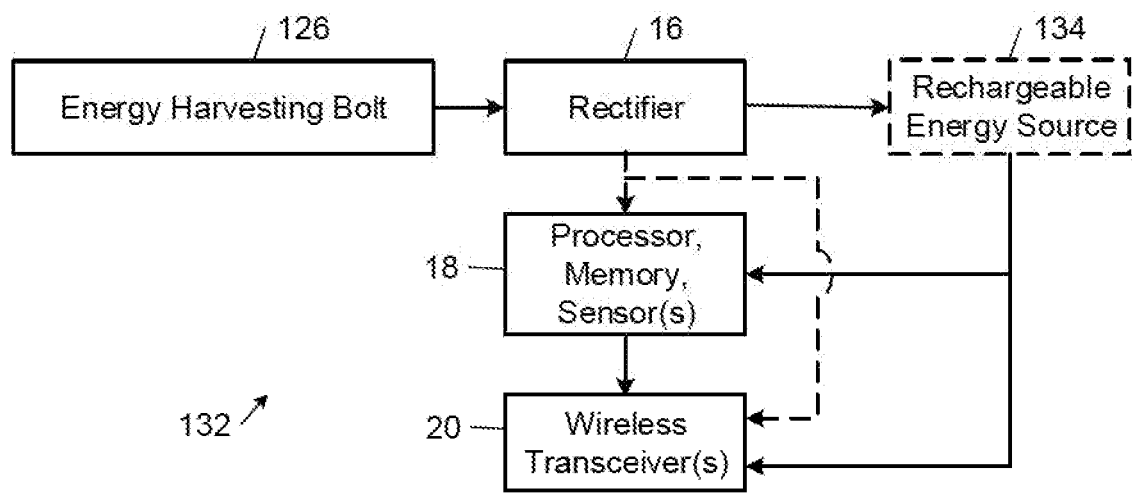
FIG. 9B shows an embodiment of a thermoelectric based energy harvesting wireless sensing circuit that includes a thermoelectric energy harvesting bolt.

FIG. 9B shows an embodiment of a thermoelectric based energy harvesting wireless sensing circuit 132 that includes a thermoelectric energy harvesting bolt 126, at least one processor, memory, and one or more sensors 18, including an optional location tracking system, that are electrically connected to a rechargeable energy source 134, which may be located in the energy harvesting bolt 126. The thermoelectric energy harvesting bolt 126 is connected to a rectifier 16 that rectifies the output of the thermoelectric energy harvesting bolt 126. The rectified output of the rectifier 16 charges the flexible rechargeable battery 134 and optionally directly powers the one or more sensors 18. In some embodiments, the flexible rechargeable battery 96 is replaced or supplemented by one or more other types of energy storage devices, including a capacitor (e.g., a supercapacitor). The thermoelectric energy harvesting bolt 126 can use one or more of the wireless transceivers 20 to communicate with one or more of network services described above (including locationing services, such as GPS) to determine or report data or information (e.g., the realtime geographic position of the energy harvesting wireless sensing circuit 132), which may be used in a variety of different applications, including logistics and the other tracking, sensing, monitoring, and reporting applications described above.

Figure 10:
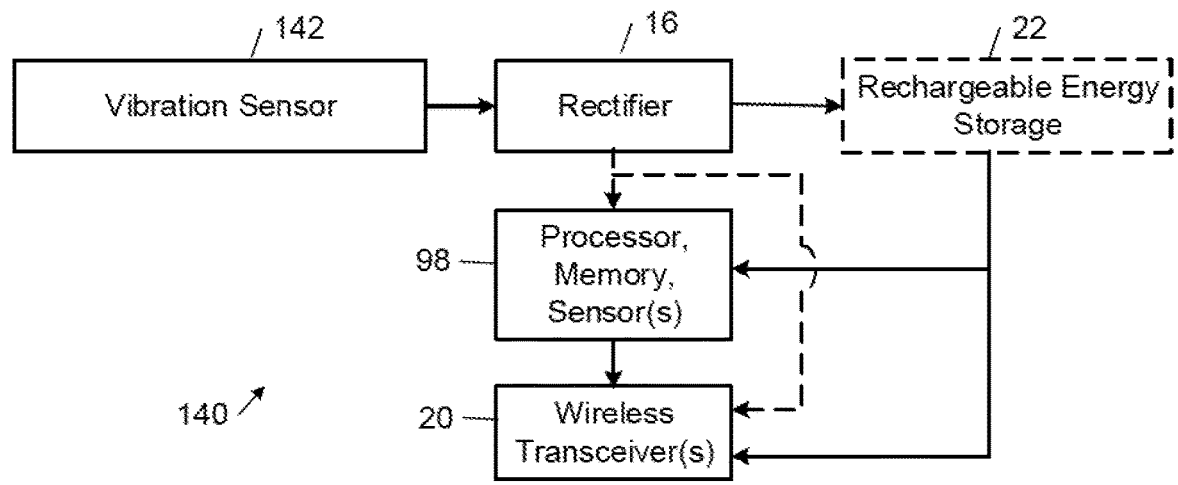
FIG. 10 is a block diagram of an example of an energy harvesting wireless sensing unit that includes a vibration sensor.

FIG. 10 shows an example of a magnetic induction based energy harvesting wireless sensing unit 140 that includes a vibration sensor 142 that is attached to the wheel rim, between the between the wheel rim 72 and the tire 76 (see FIGS. 6A and 6B). In some examples the vibration sensor 142 includes one or more of a pressure sensor, an accelerometer, an altimeter, and a piezoelectric sensor. In some examples, the sensing unit 140 uses one or more of the wireless transceivers 20 to transmit sensor data to one or more designated destinations for monitoring, diagnostic, and maintenance applications. In other examples, the sensing unit 140 includes a processor that is programmed to process the sensor data and then transmit the processed data to the one or more designated destinations.

Figure 11:
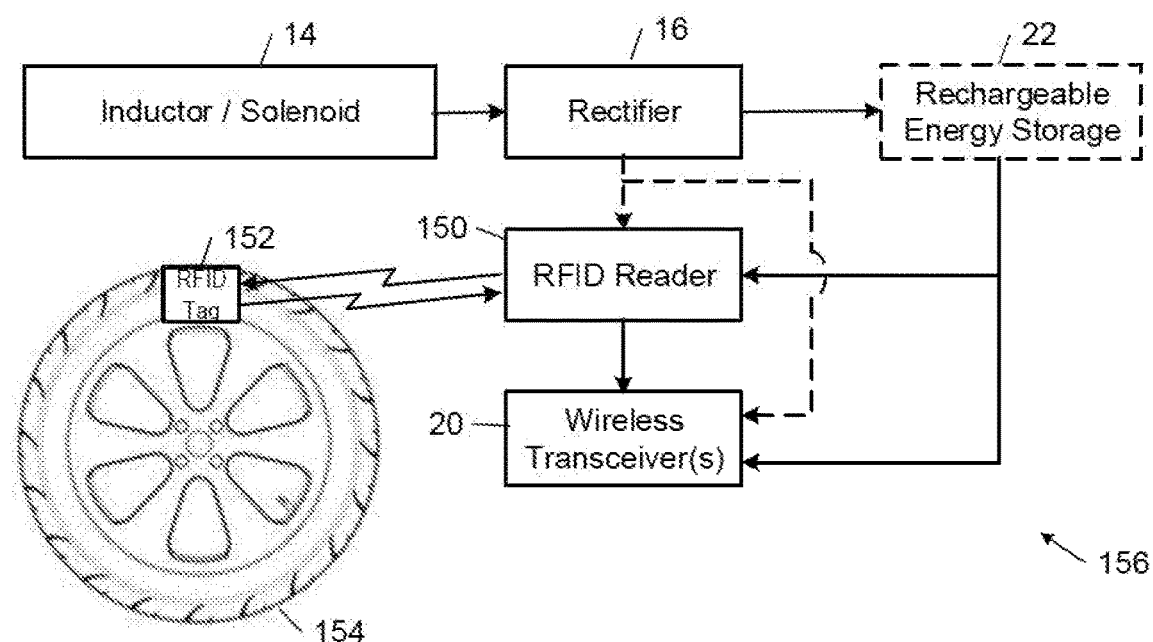
FIG. 11 is a block diagram of an example of an energy harvesting wireless sensing unit that includes an RFID reader.

FIG. 11 shows an example of a magnetic induction based energy harvesting wireless sensing unit that includes an RFID reader 150 embedded on the wheel rim 72. The RFID reader 150 uses radio waves to interrogate passive RFID tags that are within range. In the illustrated example, the RFID reader 150 is used to interrogate an RFID tag 152 that is embedded in a tire 154. The sensing unit 156 can use one or more of the wireless transceivers 20 to transmit the information received from the RFID tag 106 to one or more designated destinations for monitoring, diagnostic, and maintenance applications.

Figure 12:
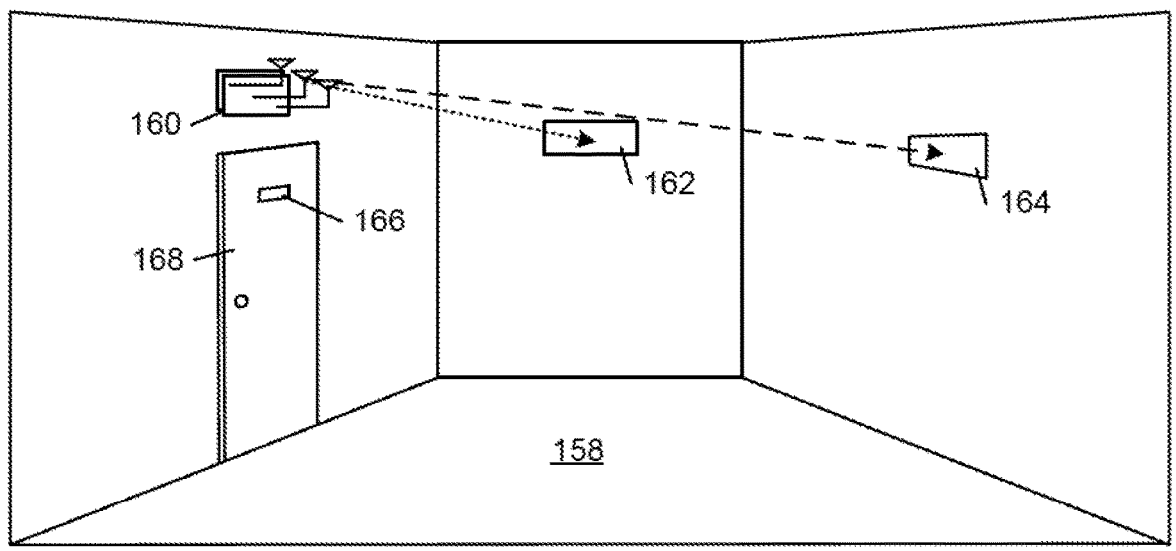
FIG. 12 is a diagrammatic view of an example room that includes a device for electrically charging a number of tape nodes in the room.

FIG. 12 shows an example of a venue 158 (e.g., a room) that includes a wireless charging system 160 that uses beam forming and beam steering techniques to efficiently transfer power to and communicate with a master tape node 162 and a peripheral tape node 164. The master tape node 162 is configured with embedded components that enables it to operate as a wireless gateway, including short and intermediate range wireless communications systems, a processor, and a memory. The peripheral tape node 164, on the other hand, includes one or more embedded components that enable it to operate as a wireless sensor node, including a short range communications system, a processor, one or more sensors, and a memory. Example sensors include pressure sensors, vibration sensors, image sensors (e.g., infrared sensors), light sensors, acoustic sensors, liquid analysis sensors, electrical sensors (e.g., ammeters), temperature sensors, a capacitive sensor, a gyroscope, an accelerometer, a temperature sensor, a strain sensor, a pressure sensor, a light sensor, a humidity sensor, altimeters, flow sensors, and location sensors (e.g., GPS sensors). In some embodiments, the wireless charging system 160 also is embodied in a tape form factor. In these embodiments, the wireless charging system 160 may operate as a master node with wireless charging capabilities.

In some embodiments, the wireless charging system 160 is configured to communicate with the master tape node 162 and the peripheral tape node 164 on a scheduled, periodic, or ad hoc basis by transmitting a ping packet to the tape nodes 162, 164. After receiving a response packet from each tape node 162, 164, the wireless charging system 160 can pair with the tape nodes 162, 164 and then determine their respective statuses. In some examples, if the wireless charging system 160 determines that one or both of the tape nodes 162, 164 have battery levels that are below a prescribed threshold, the wireless charging system 160 will transmit a respective focused RF beam to each of the tape nodes 162, 164 to charge their respective embedded energy storage components.

In some examples, the beam steering capabilities of the wireless charging system 160 provide on-demand wireless charging to the tape nodes 162, 164. For example, in some embodiments, the tape nodes 162, 164 may send request packets to the wireless charging system 160 when their battery levels are below a prescribed threshold. In response to the receipt of a request packet the wireless charging system 160 transmits a focused RF charging beam to the requesting tape node or nodes. After receiving sufficient energy to transmit one or more scheduled data packets to a target destination, the one or more tape node transmit a data packet to respective target nodes. For example, the peripheral tape node 162 may transmit the data packet to the master tape node 164. The master tape node 164, in turn, may transmit the data packet to an intermediate range wireless access point or an ISP.

In some embodiments, instead of having rechargeable batteries, the tape nodes use capacitive rechargeable energy sources (e.g., super capacitors). In these embodiments, the tape nodes have a limited amount of charge and therefore would only be able to perform a limited number of tasks before requiring additional charge. In some embodiments, the wireless charging system 160 is configured to deliver a directed burst of radiofrequency electromagnetic energy to recharge the energy levels in the capacitive energy storage components in the respective tape nodes on a scheduled or on-demand basis.

In some embodiments, one or both of the tape nodes 162 and 164 may be installed behind the respective walls of the room 158 to which they currently are attached. In particular, during construction of the room 158, before the workers put up the walls they are instructed to attach a prescribed number of tape nodes of particular types one particular ones of the studs to which the walls will be attached. In these embodiments, the tape nodes 162, 164 will be protected against damage by the walls, while still allowing the tape nodes 162, 164 to be charged through the walls.

A third tape node 166 is adhered to a door 168 located under the wireless charging system 160. In this position, the wireless charging system 160 is unable to charge the rechargeable energy source of the third tape node 166. The third tape node 166, however, includes an embedded motion sensor (e.g., an accelerometer or a gyroscope) that generates electrical energy when the door opens. The third tape node 166 also includes an electrical energy harvesting circuit that stores the motion induced electrical current in the rechargeable energy source of the third tape node 166. In some examples, the rechargeable battery in the third tape node also may be charged by a circuit embedded in the third tape node that harvests ambient RF energy using an RF receiver that converts RF energy into direct current (DC) that is coupled to an input of the rechargeable battery of the third tape node 166. Alternatively, instead of incorporating the RF receiver into the third tape node 166, the ambient RF energy converting RF receiver is a separate external component that can be placed adjacent an internal RF receiver of the third tape node 166 to charge the rechargeable battery of the third tape node 166.

Figure 13A:
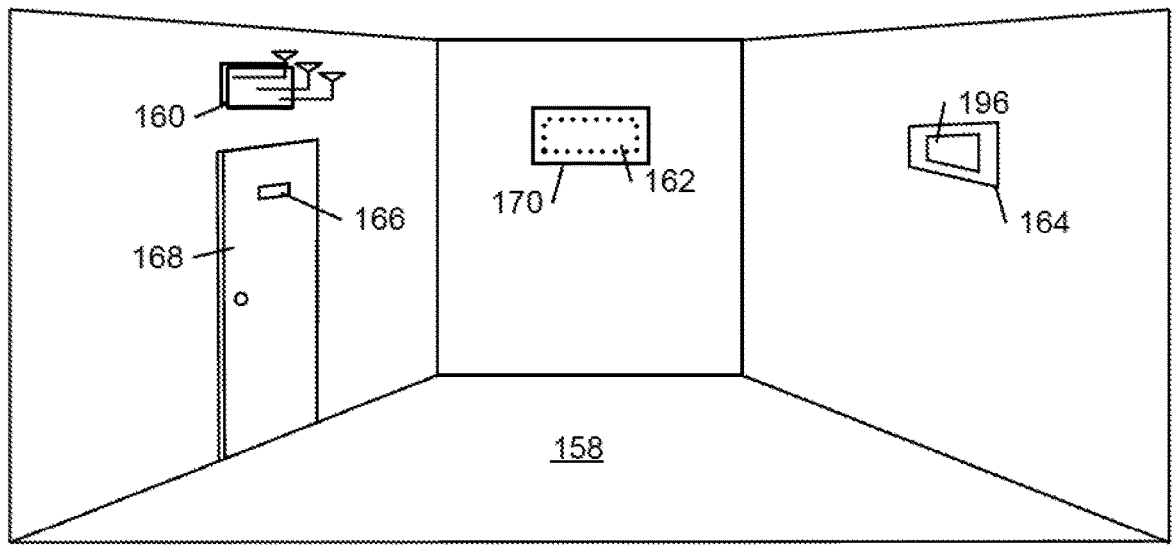
FIG. 13A is a diagrammatic view of the example room of FIG. 11 that includes tape nodes that are being charged.

FIG. 13A shows alternative embodiments for charging the tape nodes. In one embodiment, a separate charging device 170 is temporarily mounted over or positioned adjacent the tape node 162. The charging device 170 preferably does not adhere to the tape node 162. In some embodiments, the outwardly facing surface of the tape node 162 has an external non-stick surface that enables the charging device to be easily separated from the tape node 162 after being charged.

In some embodiments, the charging device 170 is implemented as a flexible adhesive tape, which may be wound onto a roll or placed on rectangular sheets that have release backings. The process of separating segments of the roll of adhesive tape or segments of a sheet of adhesive labels electrically connects electrical components embedded in each segment to a rechargeable energy source (e.g., a rechargeable battery or a capacitor) in the segment. Related examples of processes of activating tape nodes are described in U.S. patent application Ser. No. 15/842,861, filed Dec. 14, 2017, the entirety of which is incorporated herein by reference. After being activated, the charging device 170 begins to direct RF energy to a charging circuit that charges a rechargeable battery in the tape node 162.

Figure 13B:
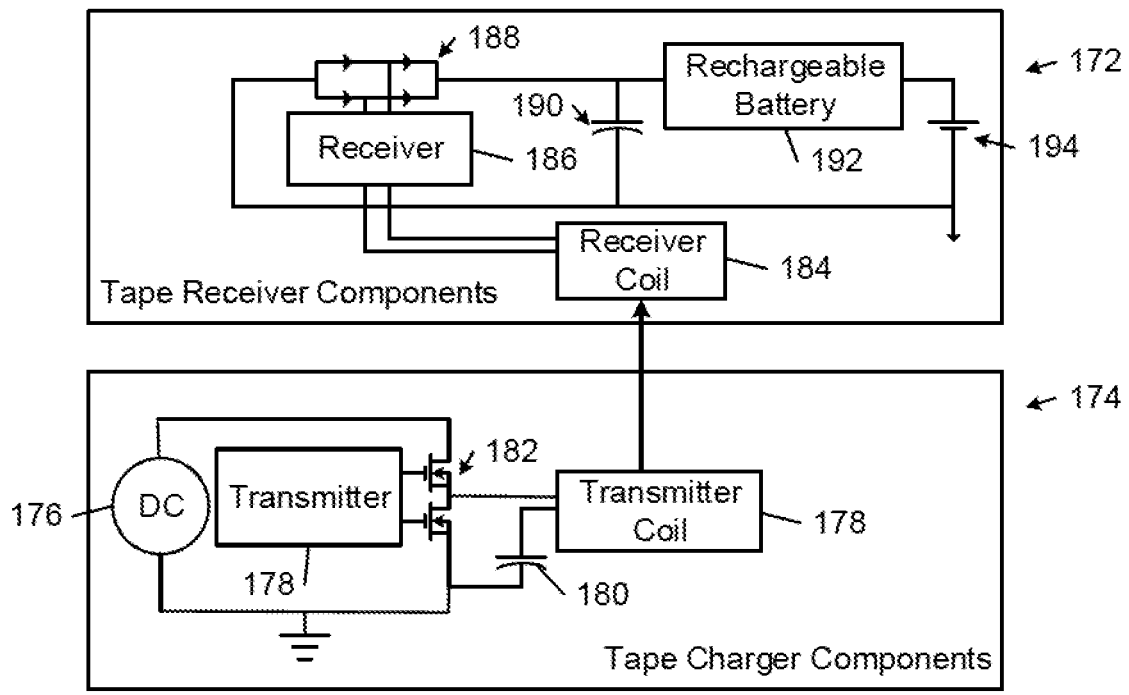
FIG. 13B is a block diagram of components of tape node charger charging a rechargeable battery in a set of tape receiver components

FIG. 13B shows an example of the tape receiver charging components 172 of the tape node 162 and an example of the tape charger components 174 of tape charging device 170. A direct current power source 176 powers a wireless charging transmitter 178. A coil 178 and a capacitor 180 are driven by a transistor bridge 182. The wireless receiver coil 184 couples the induced power to the components 172 of the tape node 162. A receiver 186 rectifies the induced power using a set of diode rectifiers 188. The received power also is filtered using one or more output capacitors 192 before delivering the current to the battery 194.

Referring back to FIG. 13A, in an alternative embodiment, the tape node 164 additionally includes a solar cell charger 196 for charging a rechargeable energy source (e.g., a rechargeable battery or a capacitor) in the tape node 164. In some embodiments, the solar cells are implemented on a flexible substrate that is integrated into the tape node 164.

Tape nodes have limited energy storage capacities. As a result, in some embodiments, the tape nodes operate in accordance with an energy based scheduling protocol in which tasks are performed based in part on the current energy levels that are available to the tape nodes. In some examples, the logical set of tape nodes consists of a hierarchical group of tape nodes that work cooperatively in performing a set of tasks or activities. The tape nodes in the group may change over time; for example, one or more tape nodes may fail and one or more tape nodes may join the group. Some or all of the tape nodes in the logical group typically have non-volatile memories for persistent storage of data, instructions, executable code, and the like.

Figure 14:
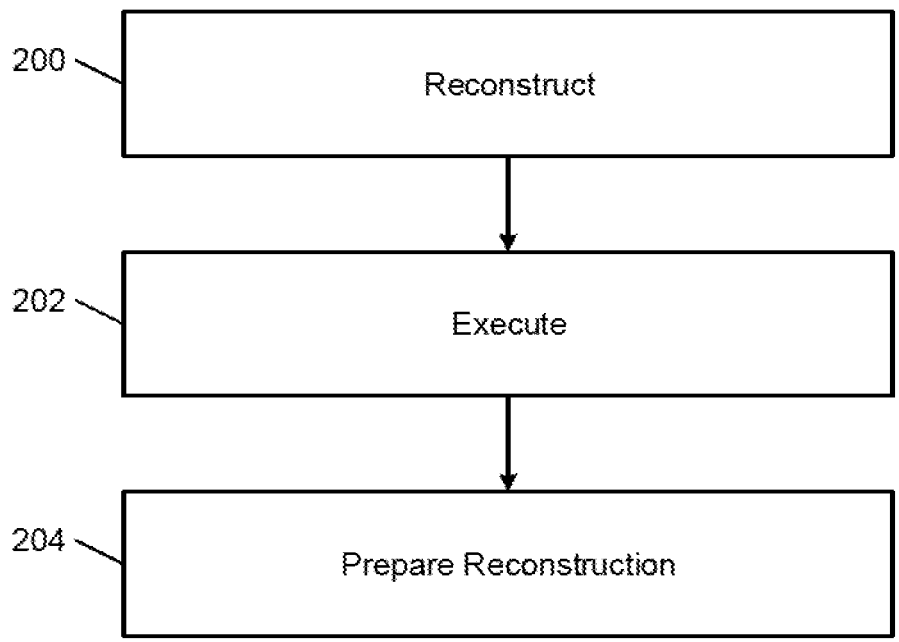
FIG. 14 is a flow diagram of a method of scheduling tasks and activities performed by a logical set of tape nodes.

FIG. 14 shows an embodiment of a flow diagram of a method of organizing or managing the activities performed by a logical group of tape nodes in a series of phases comprising: a reconstruct phase; an execute phase; and a prepare reconstruction phase.

In the reconstruct phase (FIG. 14, block 200), a master node establishes the current environment of the network. In this process, the master node retrieves from its non-volatile memory or from another node (e.g., a server nodes of a network service) information about the last state of the network, including the values of variables, algorithm parameters, the program counters and, in some embodiments, the energy levels of the tape nodes in the logical group. In some embodiments, the activities and tasks to be performed are scheduled based on a partitioning of the energy levels available on the tape nodes into respective levels (e.g., level 1 to level 10). Each activity or task to be performed is assigned a respective level on the scale. of one to ten. For example, one tape node may only have 20 joules to allocate and there is a level 1 instruction that requires 6 joules to execute and a level 2 instruction that requires 12 joules to execute, so both the level 1 and the level 2 instructions are added to the queue for execution. In some embodiments, the available energy may be partitioned by setting the cycle frequency of the processor to different levels based on the available energy level on a tape node and the tasks or activities to be performed.

In some examples, the master tape node sends the information retrieved to a network server that compiles the information retrieved by the master node and returns to the master tape node an optimized schedule of times, tasks, activities, and processor speeds to be performed and a set of coded instructions for performing those activities. The master tape node typically transmits the coded instructions to other tape nodes in the logical group for execution.

In the execute phase (FIG. 14, block 202), the master tape node and the other tape nodes in the logical group execute the assigned instructions according to the prescribed schedule. During the execute phase, peripheral tape nodes may perform a variety of tasks and activities, including using sensors to sense the physical environment (e.g., measuring temperature, pressure, humidity, acceleration, battery level, etc.) and storing the measured parameter values in non-volatile memory. In some embodiments, the peripheral tape nodes include non-volatile memory for storing the measured parameter values. In other embodiments, one or more peripheral tape nodes may not include any non-volatile memory and, instead, transmit the measured parameter values to a tape node at the next level up in the hierarchy of nodes (e.g., the master tape level).

In the prepare reconstruction phase (FIG. 14, block 204), the master tape node and other tape nodes determine the results of the activities performed during the execute phase (e.g., success or failure) and send the results up to the next level in the hierarchy of tape nodes in the group for evaluation. Depending on the success or failure of the various activities and tasks, the master tape node is able to determine the current state of the system, including the values of variables, algorithm parameters, the program counters and, in some embodiments, the energy levels of the tape nodes in the logical group.

Examples of the subject matter described herein, including the disclosed systems, methods, processes, functional operations, and logic flows, can be implemented in data processing apparatus (e.g., computer hardware and digital electronic circuitry) operable to perform functions by operating on input and generating output. Examples of the subject matter described herein also can be tangibly embodied in software or firmware, as one or more sets of computer instructions encoded on one or more tangible non-transitory carrier media (e.g., a machine readable storage device, substrate, or sequential access memory device) for execution by data processing apparatus.

The details of specific implementations described herein may be specific to particular embodiments of particular inventions and should not be construed as limitations on the scope of any claimed invention. For example, features that are described in connection with separate embodiments may also be incorporated into a single embodiment, and features that are described in connection with a single embodiment may also be implemented in multiple separate embodiments. In addition, the disclosure of steps, tasks, operations, or processes being performed in a particular order does not necessarily require that those steps, tasks, operations, or processes be performed in the particular order; instead, in some cases, one or more of the disclosed steps, tasks, operations, and processes may be performed in a different order or in accordance with a multi-tasking schedule or in parallel.

Other embodiments are within the scope of the claims.

The invention claimed is:

1. Apparatus, comprising:
a flexible adhesive tape node attached to a rotatable component and comprising an energy harvester component, a processor, a memory, a rechargeable energy source, and a wireless transmitter, wherein the flexible adhesive tape node comprises an RFID reader circuit attached to a wheel rim of a vehicle and configured to interrogate an RFID tag in a tire of the vehicle;
wherein rotation of the rotatable component generates an electric current in the energy harvester component that powers a rechargeable energy source and the rotatable component is the wheel rim of the vehicle.

2. The apparatus of claim 1, wherein the flexible adhesive tape node is attached to the wheel rim between the wheel rim and a tire of the vehicle.

3. The apparatus of claim 2, wherein the flexible adhesive tape node comprises a pressure sensor that generates output pressure values, and the wireless transmitter is operable to wirelessly transmit one or more data packets encoded with the output temperature values to a network address.

4. The apparatus of claim 2, wherein the flexible adhesive tape node comprises a temperature sensor that generates output temperature values, and the wireless transmitter is operable to wirelessly transmit one or more data packets encoded with the output temperature values to a network address.

5. Apparatus, comprising:
a flexible adhesive tape node attached to a rotatable component and comprising an energy harvester component, a processor, a memory, a rechargeable energy source, and a wireless transmitter;
wherein rotation of the rotatable component generates an electric current in the energy harvester component that powers a rechargeable energy source, wherein the rotatable component is an axle of the vehicle, wherein the energy harvester component of the flexible adhesive tape node comprises a vibration sensor that generates electrical energy in response to vibration at an output that is electrically connected to the rechargeable energy source.

6. Apparatus, comprising:
a flexible adhesive tape node attached to a rotatable component and comprising an energy harvester component, a processor, a memory, a rechargeable energy source, and a wireless transmitter;
wherein rotation of the rotatable component generates an electric current in the energy harvester component that powers a rechargeable energy source, wherein the rotatable component is an axle of the vehicle, wherein the energy harvester component of the flexible adhesive tape node comprises a thermoelectric energy generator coupled to an input of the rechargeable energy source.

7. The apparatus of claim 6, wherein the thermoelectric energy generator is embedded in a bolt attached to a wheel rim of the vehicle.

8. Apparatus, comprising:
a flexible adhesive tape node attached to a rotatable component and comprising an energy harvester component, a processor, a memory, a rechargeable energy source, and a wireless transmitter;
wherein rotation of the rotatable component generates an electric current in the energy harvester component that powers a rechargeable energy source, wherein the energy harvester component of the flexible adhesive tape node comprises a planar electrically conductive coil that is configured to couple with the magnetic field generated by the magnetic field generation component.

9. Apparatus, comprising:
a flexible adhesive tape node attached to a rotatable component and comprising an energy harvester component, a processor, a memory, a rechargeable energy source, and a wireless transmitter;
wherein rotation of the rotatable component generates an electric current in the energy harvester component that powers a rechargeable energy source, further comprising a magnetic field generation component configured to be mounted to a chassis of a vehicle adjacent a rotatable component of the vehicle; wherein rotation of the rotatable component in relation to the magnetic field generation component induces the electric current in the energy harvester component that powers the rechargeable energy source.

10. Apparatus, comprising
one or more flexible adhesive tape nodes each respectively comprising a processor, a non-volatile memory, an energy source, and a wireless transmitter, wherein at least one of the flexible adhesive tape nodes is a master node and multiple other ones of the flexible adhesive tape nodes are peripheral nodes, wherein the flexible adhesive tape nodes are adhered at respective locations and communicate with one another wirelessly over a wireless network;
in a reconstruct phase, the master node is programmed to: establish a current network environment based on a last state of the network environment stored in its non-volatile memory, receive an optimized schedule of activities, transmit sets of coded instructions to perform those activities to respective ones of the flexible adhesive tape nodes, and store the respective sets of coded instructions in non-volatile memory;
in an execute phase, the respective ones of the flexible adhesive tape nodes are programmed to execute the coded sets of instructions stored in the respective sets of coded instructions in non-volatile memory; and
in a prepare reconstruction phase, the master and peripheral tape nodes are programmed to determine results of the execute phase, and to transmit the determined results to respective flexible adhesive tape nodes to respective next levels up in a hierarchy of the flexible adhesive tape nodes.

11. The apparatus of claim 10, wherein, in the reconstruct phase, the master node is programmed to establish the last state of the network environment based on data comprising values of variables, algorithm parameters, program counters, and energy levels of the flexible adhesive tape nodes.

12. A system, comprising:
a receiver, comprising flexible adhesive tape node comprising a receiver planar coil, a processor, a memory, a rechargeable energy source, and a wireless transceiver;

wireless charger, comprising a flexible adhesive tape node comprising a transmitter planar coil, a processor, a memory, an energy source, and a wireless transceiver, wherein the memory of the wireless charger flexible adhesive tape node stores coded instructions to wirelessly ascertain a charge level of the rechargeable energy source of the receiver flexible adhesive tape node and, based on a determination that the charge level is below a threshold, initiate a process of wirelessly charging the rechargeable energy source by steering a radiofrequency beam toward a location of the receiver for a specified duration.

13. The apparatus of claim 12, wherein the wireless charger is operable to steer an RF charging beam toward the receiver.

* * * * *

UNITED STATES PATENT AND TRADEMARK OFFICE
CERTIFICATE OF CORRECTION

PATENT NO. : 10,819,137 B2
APPLICATION NO. : 16/359808
DATED : October 27, 2020
INVENTOR(S) : Khoche et al.

It is certified that error appears in the above-identified patent and that said Letters Patent is hereby corrected as shown below:

On the Title Page

Item (72), Inventors, "Erik Volkerink" should read --Hendrik J. Volkerink--;

In the Specification

Column 1, Line 52, "axel" should read --axle--;

Column 14, Line 8, "axel" should read --axle--;

In the Claims

In Claim 3 at Column 19, Lines 34-35, "transmit one or more data packets encoded with the output temperature values to a network address" should read --transmit one or more data packets encoded with the output pressure values to a network address--;

In Claim 8 at Column 20, lines 14-15, "the magnetic field generated by the magnetic field generation component" should read --a magnetic field generated by a magnetic field generation component--.

Signed and Sealed this
Nineteenth Day of September, 2023

Katherine Kelly Vidal
*Director of the United States Patent and Trademark Office*